United States Patent
Koike

(10) Patent No.: US 7,265,622 B1
(45) Date of Patent: Sep. 4, 2007

(54) DIFFERENTIAL DIFFERENCE AMPLIFIER

(75) Inventor: Hideharu Koike, Yokohama (JP)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 11/389,210

(22) Filed: Mar. 27, 2006

(51) Int. Cl.
*H03F 3/45* (2006.01)

(52) U.S. Cl. .......................... 330/253; 330/261

(58) Field of Classification Search ......... 330/253, 330/257, 258, 261, 69
See application file for complete search history.

(56) References Cited

U.S. PATENT DOCUMENTS

| | | | |
|---|---|---|---|
| 4,667,165 A * | 5/1987 | De Weck | 330/253 |
| 6,111,437 A | 8/2000 | Patel | |
| 6,400,225 B1 | 6/2002 | Kruiskamp | |
| 6,778,014 B2 | 8/2004 | Rennig | |
| 7,209,842 B2 * | 4/2007 | Mizuno et al. | 702/64 |
| 7,215,153 B2 * | 5/2007 | Li | 326/83 |

* cited by examiner

*Primary Examiner*—Henry Choe
(74) *Attorney, Agent, or Firm*—Finnegan, Henderson, Farabow, Garrett & Dunner LLP

(57) ABSTRACT

A differential difference amplifier includes a first pair of differential input terminals and a second pair of differential input terminals. The differential difference amplifier has a pair of differential output terminals to output a voltage in relation to a difference between differential voltages at the first pair of differential input terminals and differential voltages at the second pair of differential input terminals.

30 Claims, 19 Drawing Sheets

DIFFERENTIAL DIFFERENCE AMPLIFIER

TECHNICAL FIELD

This invention generally relates to differential difference amplifiers.

BACKGROUND

Low Voltage Differential Signaling (LVDS) interfaces are increasingly used for the large scale integration of electronic consumer products. An LVDS receiver comprising at least one differential difference amplifier (DDA) is used to receive and amplify an LVDS signal for use by other electronic circuits.

An exemplary version of a conventional LVDS receiver 110 is illustrated in the schematic diagram of FIG. 1. This LVDS receiver 110 comprises two DDA's 120a,b, one differential amplifier 130, and a multiplexer 140. A conventional embodiment of the individual DDA's 120a and 120b is illustrated in the schematic diagram of FIG. 2. This DDA 120 comprises a first pair of p-channel metal-oxide-semiconductor (PMOS) transistors 210a,b and a second pair of PMOS transistors 220a,b. The DDA 120 further comprises four n-channel metal-oxide-semiconductor (NMOS) transistors 230a-230d and four PMOS transistors 240a-240d, configured as shown in FIG. 2.

However, the conventional LVDS receiver 110 of FIG. 1 is susceptible to signal noise. Also, this LVDS receiver 110 is not capable of operating at low voltages, as sometimes required by mobile applications. Furthermore, this conventional LVDS receiver 110 can malfunction when a common mode voltage of an input voltage pair (PAD, PADN) is close to $V_{SS}$, e.g., ground, while the common mode voltage of a reference voltage pair ($V_{ref1}$, $V_{ref2}$) is close to $V_{DD}/2$, where $V_{DD}$ corresponds to a power supply voltage. In this situation, the drain voltages of the first transistor pair 210a,b, shown in FIG. 2, are pulled to approximately the level of the drain voltages of the second transistor pair 220a,b. The respective drain-to-source voltages of the first transistor pair 210a,b and the second transistor pair 220a,b cause the first transistor pair 210a,b to operate in a "triode" region, which is also referred to as a "resistive" region, while the second transistor pair 220a,b operates in a "pentode" region, which is also referred to as a "saturation" region. This difference in the respective operating regions of the two transistor pairs 210a,b, 220a,b results in an output voltage $V_{out}$ at a node 250 having an amplitude that is not proportional to the difference between the differential of the input voltage pair (PAD, PADN) and the differential of the reference voltage pair ($V_{ref1}$, $V_{ref2}$).

Another version of an LVDS receiver is the conventional differential operational amplifier (op-amp) 310 illustrated in the schematic diagram of FIG. 3. This differential op-amp 310 comprises NMOS FETs 320a-320j, PMOS FETs 330a-330j, resistors 340a-340c, a capacitor 350, and an inverter 360, configured as shown in FIG. 3. The differential op-amp 310 may permit operation across a wider common mode range (CMR). However, this differential op-amp 310 is also susceptible to signal noise and generally incapable of operating at low voltages.

Thus, it is desirable to have a DDA adapted to operate effectively across a wider CMR. It is also desirable for the DDA to have increased tolerance to noise. It is still further desirable for the DDA to be able to operate at low voltages.

SUMMARY

A differential difference amplifier includes first and second low supply output terminals and first and second high supply output terminals, one or more of the first and second low supply output terminals and one or more of the first and second high supply output terminals being coupled to a low voltage terminal and a high voltage terminal, respectively. A first bias regulator comprises a first output terminal to supply a first bias voltage and a second output terminal to supply a second bias voltage. A second bias regulator comprises first and second output terminals.

First, second, third, and fourth current control PMOS transistors are also provided, each having a gate, a source, and a drain. The sources of these transistors are coupled to one another and to the second high supply output terminal. The gates of the first and second current control PMOS transistors are coupled to first and second terminals of a first pair of differential input terminals, respectively. The gates of the third and fourth current control PMOS transistors are coupled to first and second terminals of a second pair of differential input terminals, respectively.

The differential difference amplifier further comprises first and second load current control PMOS transistors, each having a gate, a source, and a drain. The sources of the first and second load current control PMOS transistors are coupled to the first high output terminal, and the gates of the first and second load current control PMOS transistors are coupled to the first output terminal of the first bias regulator.

First, second, third, and fourth current control NMOS transistors are also provided, each having a gate, a source, and a drain. The sources of the first, second, third, and fourth current control NMOS transistors are coupled to each other and to the second low supply output terminal. The gates of the first and second current control NMOS transistors are coupled to the first and second terminals of the first pair of differential input terminals, respectively. The gates of the third and fourth current control NMOS transistors are coupled to the first and second terminals of the second pair of differential input terminals, respectively.

The differential difference amplifier additionally includes first and second load current control NMOS transistors, each having a gate, a source, and a drain. The sources of the first and second load current control NMOS transistors are coupled to the first low supply output terminal, and the gates of the first and second load current control NMOS transistors are coupled to the second output terminal of the first bias regulator.

First and second voltage control PMOS transistor circuits are further provided, each having a gate terminal, at least one source terminal, and a drain terminal. The at least one source terminal of the first voltage control PMOS transistor is coupled to the drains of the first and fourth current control PMOS transistors and to the drain of the first load current control PMOS transistor. The at least one source terminal of the second voltage control PMOS transistor circuit is coupled to the drains of the second and third current control PMOS transistors and to the drain of the second load current control PMOS transistor. The gate terminal of the first voltage control PMOS transistor circuit is coupled to the first output terminal of the second bias regulator. The gate terminal of the second voltage control PMOS transistor circuit is coupled to the second output terminal of the second bias regulator.

In addition, first and second voltage control NMOS transistor circuits are provided, each having a gate terminal, at least one source terminal, and a drain terminal. The at least one source terminal of the first voltage control NMOS transistor circuit is coupled to the drains of the first and fourth current control NMOS transistors and to the drain of the first load current control NMOS transistor. The at least one source terminal of the second voltage control NMOS transistor circuit is coupled to the drains of the second and third current control NMOS transistors and to the drain of the second load current control NMOS transistor. The gate terminal of the first voltage control NMOS transistor circuit is coupled to the first output terminal of the second bias regulator. The gate terminal of the second voltage control NMOS transistor circuit is coupled to the second output terminal of the second bias regulator.

The drain terminals of the second voltage control PMOS transistor circuit and the second voltage control NMOS transistor circuit are coupled to a first terminal of a pair of differential output terminals. The drain terminals of the first voltage control PMOS transistor circuit and the first voltage control NMOS transistor circuit are coupled to a second terminal of the pair of differential output terminals.

In another embodiment, the gates of the first and second load current control PMOS transistors are coupled to the first and second output terminals, respectively, of the second bias regulator. The gates of the first and second load current control NMOS transistors are coupled to the first and second output terminals, respectively, of the second bias regulator. The gate terminal of the first voltage control PMOS transistor circuit is coupled to the first output terminal of the second bias regulator. The gate terminal of the second voltage control PMOS transistor circuit is coupled to the second output terminal of the second bias regulator. The gate terminal of the first voltage control NMOS transistor circuit is coupled to the first output terminal of the second bias regulator. The gate terminal of the second voltage control NMOS transistor circuit is coupled to the second output terminal of the second bias regulator.

In yet another embodiment, the gates of the first and second load current control PMOS transistors are coupled to the first and second output terminals, respectively, of the second bias regulator. The gates of the first and second load current control NMOS transistors are coupled to the first and second output terminals, respectively, of the second bias regulator. The gate terminals of the first and second voltage control PMOS transistor circuits are coupled to the first output terminal of the first bias regulator. The gate terminals of the first and second voltage control NMOS transistor circuits are coupled to the second output terminal of the first bias regulator.

BRIEF DESCRIPTION OF THE DRAWINGS

The accompanying drawings, which are incorporated in and constitute a part of this specification, illustrate embodiments of the invention and, together with the description, serve to explain advantages and principles of the invention. In the drawings.

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

A differential difference amplifier (DDA) is adapted to amplify a difference between two differential inputs applied to the DDA as an input voltage pair ($V_{PP}$, $V_{PN}$) and a reference voltage pair ($V_{NP}$, $V_{NN}$). The DDA can be used in a variety of applications, including as part of a "low voltage differential signal" (LVDS) receiver that is adapted to receive and amplify an LVDS signal for use by downstream circuitry.

Figure 1:
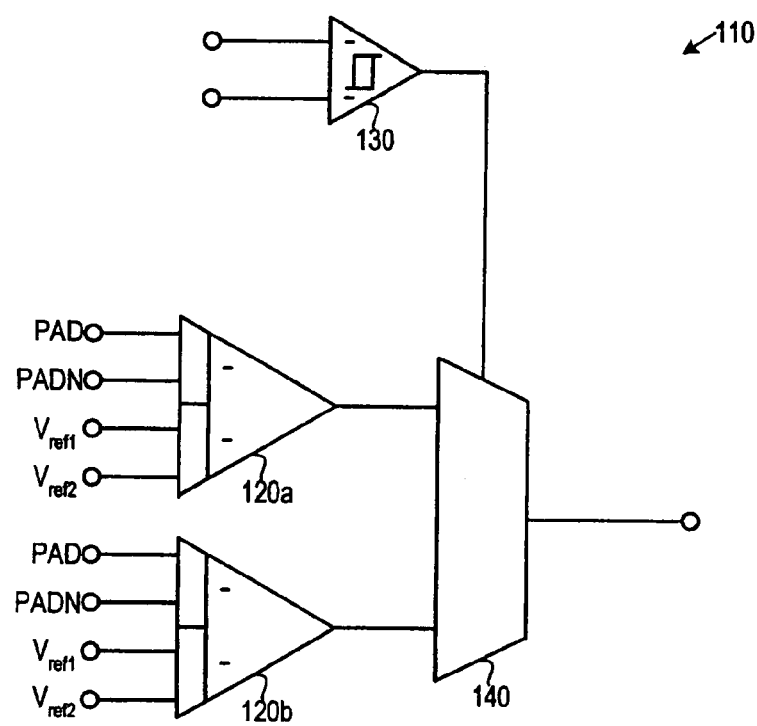
FIG. 1 is a schematic diagram of an embodiment of a conventional low voltage differential signaling (LVDS) receiver.
Figure 2:
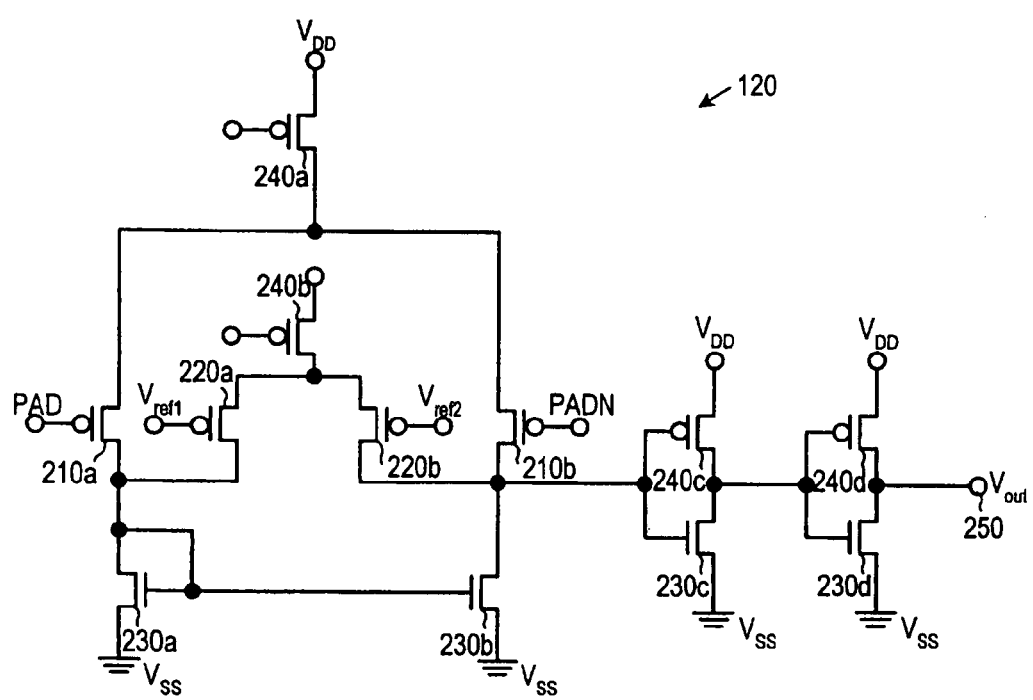
FIG. 2 is a schematic diagram of an embodiment of a conventional differential difference amplifier (DDA) in the LVDS receiver of FIG. 1.
Figure 3:
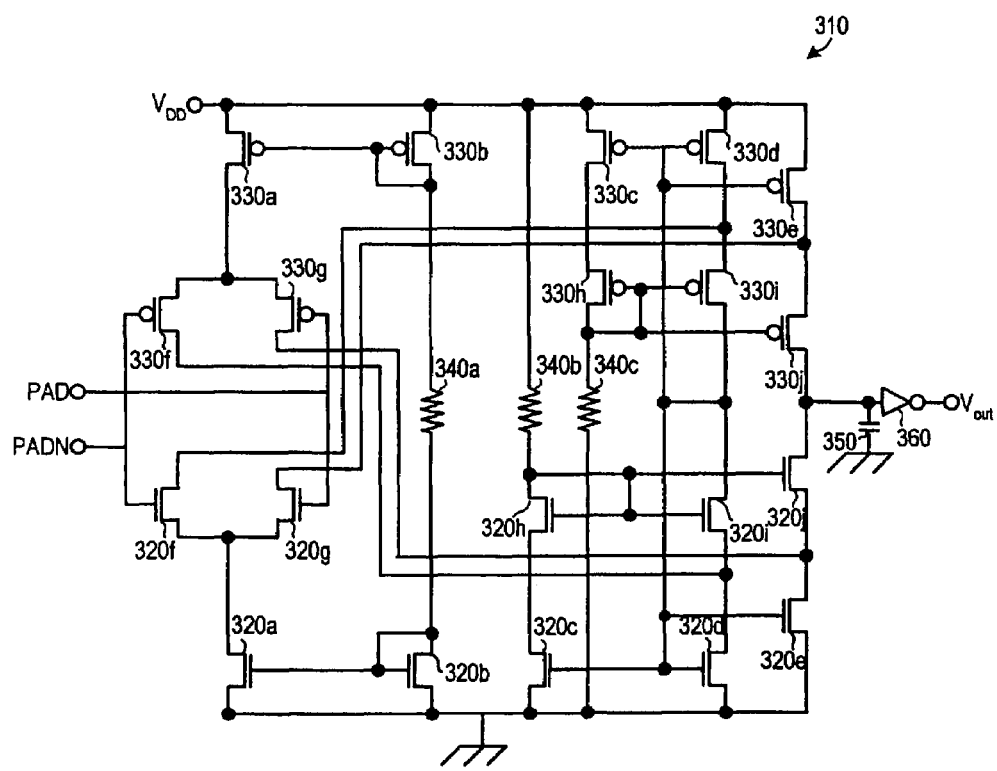
FIG. 3 is a schematic diagram of an embodiment of a conventional LVDS receiver that is a differential op-amp.
Figure 4:
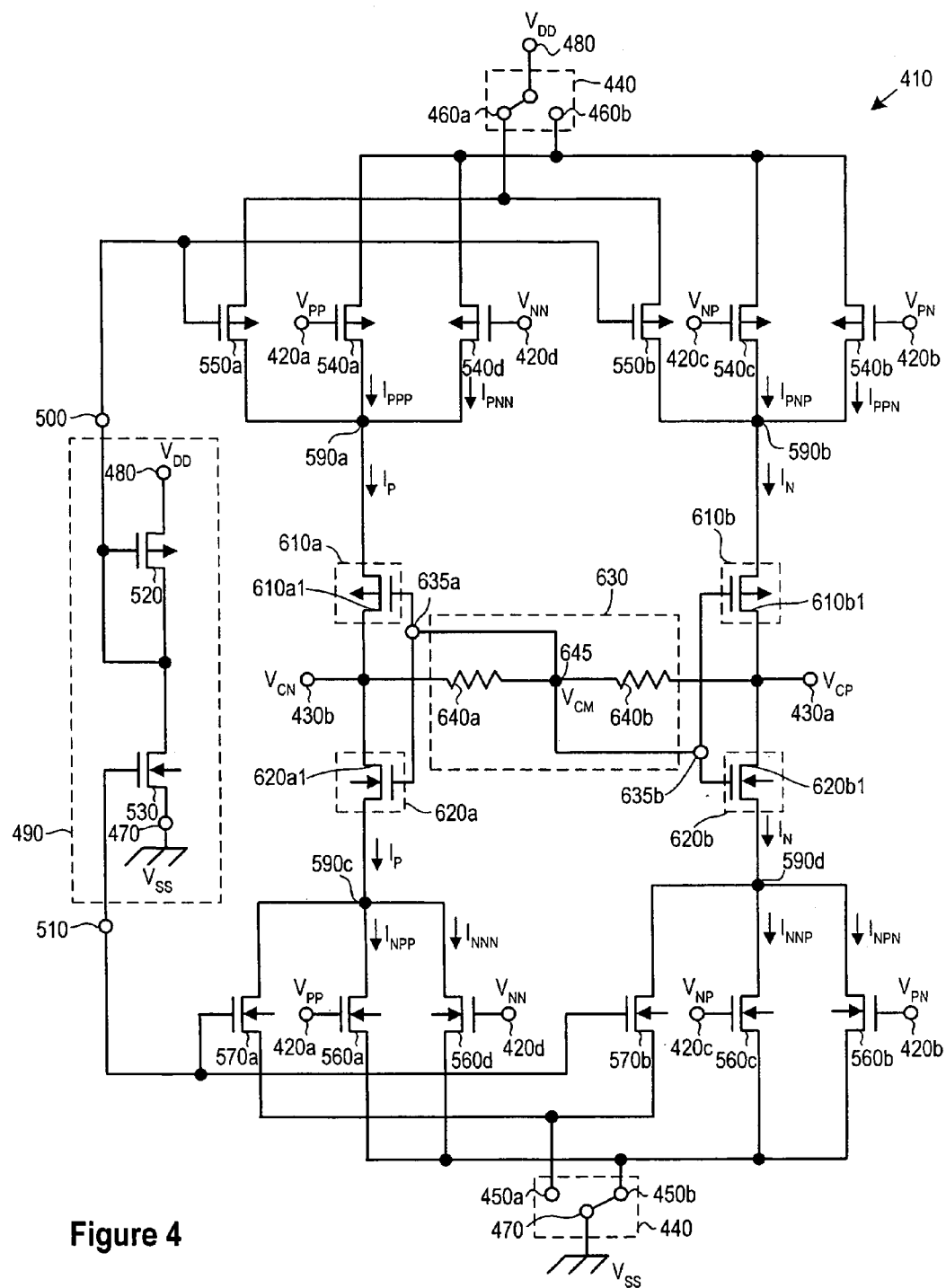
FIG. 4 is a schematic diagram of an embodiment of a differential difference amplifier (DDA), consistent with the present invention.
Figure 5:
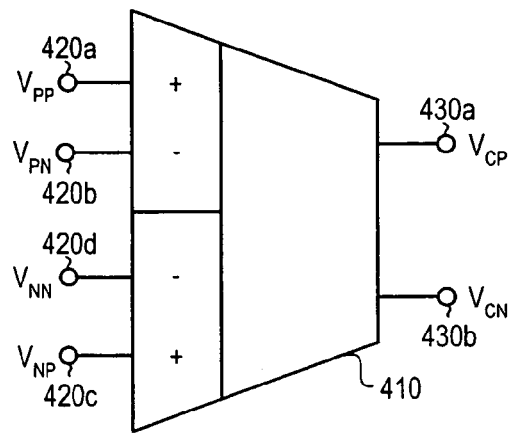
FIG. 5 is a schematic diagram of a schematic object that represents a differential difference amplifier.

FIG. 4 is a schematic diagram of an exemplary embodiment of a DDA 410, consistent with the present invention. The DDA 410 of FIG. 4 is provided only to illustrate the invention, and should not be used to limit the scope of the invention or its equivalents to the exemplary embodiments provided herein. Throughout some of the remaining drawings, the DDA 410 is represented by the object shown in the schematic diagram of FIG. 5.

As illustrated in FIG. 4, the DDA 410 comprises a first pair of differential input terminals having first and second terminals 420a, 420b to receive the input voltage pair $V_{PP}$, $V_{PN}$, respectively, and a second pair of differential input terminals having first and second terminals 420c, 420d to receive the reference voltage pair $V_{NP}$, $V_{NN}$, respectively. The DDA 410 also comprises a pair of differential output terminals having first and second terminals 430a, 430b.

The DDA 410 comprises a low voltage terminal 470 that is at a low voltage ($V_{SS}$) and a high voltage terminal 480 that is at a high voltage ($V_{DD}$). One or more of the low voltage $V_{SS}$ and the high voltage $V_{DD}$ may be received from a power supply. In one embodiment, the low voltage $V_{SS}$ is an electrical ground, such as shown in FIG. 4. The DDA 410 also comprises first and second low supply output terminals 450a, 450b and first and second high supply output terminals 460a, 460b. One or more of the first and second low supply output terminals 450a, 450b are coupled to the low voltage terminal 470, and one or more of the first and second high supply output terminals 460a, 460b are coupled to the high voltage terminal 480.

A first bias regulator 490 comprises a first output terminal 500 to supply a first bias voltage and a second output terminal 510 to supply a second bias voltage in the DDA 410. In one embodiment, illustrated in FIG. 4, the first bias regulator 490 comprises a PMOS transistor 520 having a source that is coupled to the high voltage $V_{DD}$, and a drain and a gate that are coupled to the first output terminal 500. The first bias regulator 490 also comprises an NMOS transistor 530 having a source that is coupled to the low voltage $V_{SS}$, a drain that is coupled to the drain of the PMOS transistor 520, and a gate that is coupled to the second output terminal 510.

The DDA 410 further comprises first, second, third, and fourth current control PMOS transistors 540a-540d, each of the transistors 540a-540d having a gate, a source, and a drain. The sources of the current control PMOS transistors 540a-540d are coupled to one another and to the second high supply output terminal 460b. The gates of the first and second current control PMOS transistors 540a, 540b are coupled to the first and second terminals 420a, 420b of the first pair of differential input terminals, respectively. The gates of the third and fourth current control PMOS transistors 540c, 540d are coupled to the first and second terminals 420c, 420d of the second pair of differential input terminals, respectively.

The DDA 410 also comprises first and second load current control PMOS transistors 550a, 550b, each of the transistors 550a, 550b having a gate, a source, and a drain. The sources of the load current control PMOS transistors 550a, 550b are coupled to the first high supply output terminal 460a. The gates of the load current control PMOS transistors 550a, 550b are coupled to the first output terminal 500 of the first bias regulator 490.

The DDA 410 additionally comprises first, second, third, and fourth current control NMOS transistors 560a-560d. Each of the transistors 560a-560d also has a gate, a source, and a drain. The sources are coupled to each other and to the second low supply output terminal 450b. The gates of the first and second current control NMOS transistors 560a, 560b are coupled to the first and second terminals 420a, 420b of the first pair of differential input terminals, respectively. The gates of the third and fourth current control NMOS transistors 560c, 560d are coupled to the first and second terminals 420c, 420d of the second pair of differential input terminals, respectively.

In addition, the DDA 410 comprises first and second load current control NMOS transistors 570a, 570b. Each of the load current control NMOS transistors 570a, 570b has a gate, a source, and a drain. The sources are coupled to the first low supply output terminal 450a, and the gates are coupled to the second output terminal 510 of the first bias regulator 490.

The first, second, third, and fourth current control PMOS transistors 540a-540d may have substantially the same electrical characteristics as one another. Also, the first and second load current control PMOS transistors 550a, 550b may have substantially the same electrical characteristics as each other, and higher conductances than the first, second, third, and fourth current control PMOS transistors 540a-540d. The first, second, third, and fourth current control NMOS transistors 560a-560d may also have substantially the same electrical characteristics as one another. In addition, the first and second load current control NMOS transistors 570a, 570b may have substantially the same electrical characteristics as each other, and higher conductances than the first, second, third, and fourth current control NMOS transistors 560a-560d.

The DDA 410 comprises first and second voltage control PMOS transistor circuits 610a, 610b, each of the circuits 610a, 610b comprising one or more PMOS transistors 610a1, 610b1, respectively, having a gate terminal, a source terminal, and a drain terminal. The source terminal of the first voltage control PMOS transistor circuit 610a is coupled to the drains of the first and fourth current control PMOS transistors 540a, 540d and to the drain of the first load current control PMOS transistor 550a at a node 590a. The source terminal of the second voltage control PMOS transistor circuit 610b is coupled to the drains of the second and third current control PMOS transistors 540b, 540c and to the drain of the second load current control PMOS transistor 550b at a node 590b. First and second voltage control NMOS transistor circuits 620a, 620b are also provided, each of the circuits 620a, 620b comprising one or more NMOS transistors 620a1, 620b1, respectively, and also having a gate terminal, a source terminal, and a drain terminal. The source terminal of the first voltage control NMOS transistor circuit 620a is coupled to the drains of the first and fourth current control NMOS transistors 560a, 560d and to the drain of the first load current control NMOS transistor 570a at a node 590c. The source terminal of the second voltage control NMOS transistor circuit 620b is coupled to the drains of the second and third current control NMOS transistors 560b, 560c and to the drain of the second load current control NMOS transistor 570b at a node 590d.

The first terminal 430a of the pair of differential output terminals is coupled to the drain terminal of the second voltage control PMOS transistor circuit 610b and to the drain terminal of the second voltage control NMOS transistor circuit 620b. The second terminal 430b of the pair of differential output terminals is coupled to the drain terminal of the first voltage control PMOS transistor circuit 610a and to the drain terminal of the first voltage control NMOS transistor circuit 620a.

The first and second voltage control PMOS transistor circuits 610a, 610b may have substantially the same electrical characteristics as each other. The first and second voltage control PMOS transistor circuits 610a, 610b may also have higher conductance than the first, second, third, and fourth current control PMOS transistors 540a-540d. In addition, the first and second voltage control NMOS transistor circuits 620a, 620b may have substantially the same electrical characteristics as each other. Furthermore, the first and second voltage control NMOS transistor circuits 620a, 620b may have higher conductance than the first, second, third, and fourth current control NMOS transistors 560a-560d.

A second bias regulator 630 is coupled to the gate terminal of the first voltage control PMOS transistor circuit 610a and the gate terminal of the first voltage control NMOS transistor circuit 620a at a first output terminal 635a, to the gate terminal of the second voltage control PMOS transistor circuit 610b and the gate terminal of the second voltage control NMOS transistor circuit 620b at a second output terminal 635b.

One exemplary embodiment of the second bias regulator 630 is shown in FIG. 4. In this embodiment, the second bias regulator 630 comprises a first resistor 640a having a first terminal and a second terminal. The first terminal of the first resistor 640a is coupled to the second terminal 430b of the pair of differential output terminals. A second resistor 640b also has a first terminal and a second terminal. The first terminal of the second resistor 640b is coupled to the second terminal of the first resistor 640a, to the gate terminals of the first and second voltage control PMOS transistor circuits 610a, 610b, and to the gate terminals of the first and second voltage control NMOS transistor circuits 620a, 620b. The second terminal of the second resistor 640b is coupled to the first terminal 430a of the pair of differential output terminals. A center voltage $V_{CM}$ of a magnitude that is approximately the mean of the magnitudes of first and second differential output voltages $V_{CP}$, $V_{CN}$ at the pair of differential output terminals 430a, 430b is generated at a node 645. In one version, the first and second resistors 640a, 640b of the second bias regulator 630 have substantially the same electrical resistance.

Figure 6:
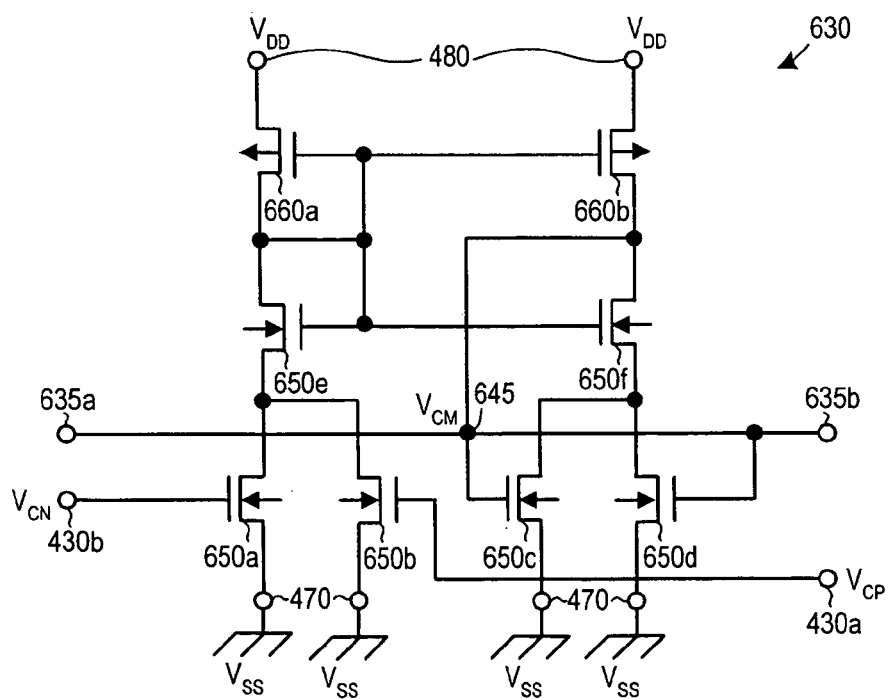
FIG. 6 is a schematic diagram of an embodiment of a second bias control in FIG. 4.

FIG. 6 is a schematic diagram of another embodiment of the second bias regulator 630. This embodiment of the second bias regulator 630 also generates the center voltage $V_{CM}$ of the pair of differential output voltages $V_{CP}$, $V_{CN}$. The second bias regulator 630 comprises first, second, third, fourth, fifth, and sixth NMOS transistors 650a-650f. Also provided are first and second PMOS transistors 660a, 660b. Each of the transistors 650a-650f, 660a, 660b comprises a gate, a source, and a drain.

The sources of the first, second, third, and fourth NMOS transistors 650a-650d are coupled to the low voltage terminal 470 to receive the low voltage $V_{SS}$. The drains of the first and second NMOS transistors 650a, 650b are coupled to the source of the fifth NMOS transistor 650e. The drains of the third and fourth NMOS transistors 650c, 650d are coupled to the source of the sixth NMOS transistor 650f. The drain of the fifth NMOS transistor 650e is coupled to the gate of the fifth NMOS transistor 650e, to the gate of the sixth NMOS transistor 650f, to the drain of the first PMOS transistor 660a, and to the gates of the first and second PMOS transistors 660a, 660b. The drain of the sixth NMOS transistor 650f is coupled to the drain of the second PMOS transistor 660b. The sources of the first and second PMOS transistors 660a, 660b are coupled to the high voltage terminal 480 to receive the high voltage $V_{DD}$. The gates of the third and fourth NMOS transistors 650c, 650d are coupled to each other, to the drain of the sixth NMOS transistor 650f, and to the first and second output terminals 635a, 635b of the second bias regulator 630. The gate of the first NMOS transistor 650a is coupled to the second terminal 430b of the pair of differential output terminals of the DDA 410. The gate of the second NMOS transistor 650b is coupled to the first terminal 430a of the pair of differential output terminals of the DDA 410.

Figure 7:
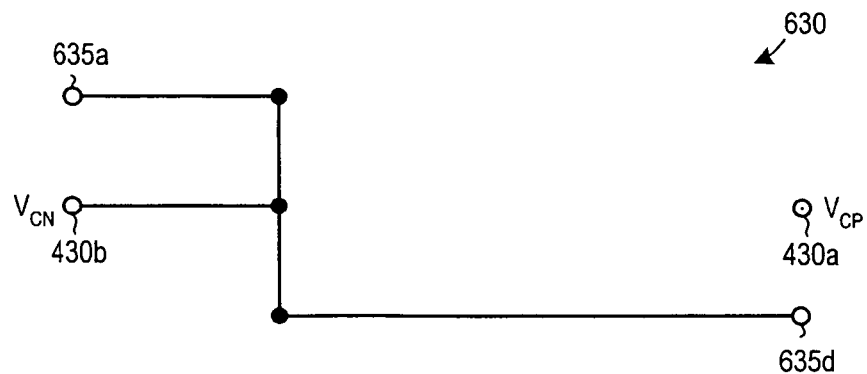
FIG. 7 is a schematic diagram of another embodiment of the second bias control in FIG. 4.

FIG. 7 is a schematic diagram of yet another exemplary embodiment of the second bias regulator 630. In this embodiment of the second bias regulator 630, the first and the second output terminals 635a, 635b are coupled to the second terminal 430b of the pair of differential output terminals of the DDA 410. Thus, the gate terminals of the first voltage control NMOS transistor circuit 620a and of the first voltage control PMOS transistor circuit 610a are coupled to the gate terminals of the second voltage control PMOS transistor circuit 610b and of the second voltage control NMOS transistor circuit 620b, and to the second terminal 430b of the pair of differential output terminals.

Figure 8:
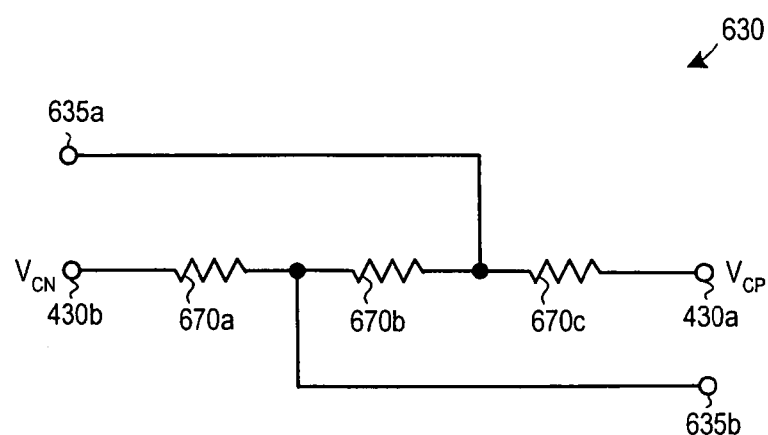
FIG. 8 is a schematic diagram of yet another embodiment of the second bias control in FIG. 4.

FIG. 8 is a schematic diagram of a further exemplary embodiment of the second bias regulator 630. The second bias regulator 630 of this embodiment comprises first, second, and third resistors 670a-670c. Each of the resistors 670a-670c has a first terminal and a second terminal. The second terminal of the first resistor 670a and the first terminal of the second resistor 670b are coupled to each other and to the second output terminal 635b in order to couple to the gate terminals of the second voltage control PMOS transistor circuit 610b and of the second voltage control NMOS transistor circuit 620b. The second terminal of the second resistor 670b and the first terminal of the third resistor 670c are coupled to each other and to the first output terminal 635a in order to couple to the gate terminals of the first voltage control PMOS transistor circuit 610a and of the first voltage control NMOS transistor circuit 620a. The first terminal of the first resistor 670a is coupled to the second terminal 430b of the pair of differential output terminals of the DDA 410. The second terminal of the third resistor 670c is coupled to the first terminal 430a of the pair of differential output terminals of the DDA 410.

Because of the voltage control PMOS and NMOS transistor circuits 610a, 610b, 620a, 620b, the common mode voltage between the first and second output terminals 635a, 635b of the second bias regulator 630 results in a negative feedback to the center voltage $V_{CM}$ of the differential output voltages $V_{CP}$, $V_{CN}$ of the DDA 410, while the positive differential voltage between the first and the second output terminals 635a, 635b of the second bias regulator 630 results in a positive feedback to the differential output voltages $V_{CP}$, $V_{CN}$ of the DDA 410. Thus, the second bias regulator 630 of FIG. 8 causes the DDA 410 to function as a comparator.

The DDA 410 may comprise a switching voltage supply 440, as shown in FIG. 4, to couple the low voltage $V_{SS}$ and the high voltage $V_{DD}$ to the DDA 410. The switching voltage supply 440 is adapted to selectively couple, to the low voltage terminal 470 and the high voltage terminal 480, either (i) the first low supply output terminal 450a and the second high supply output terminal 460b, respectively, or (ii) the second low supply output terminal 450b and the first high supply output terminal 460a, respectively.

Figure 9:
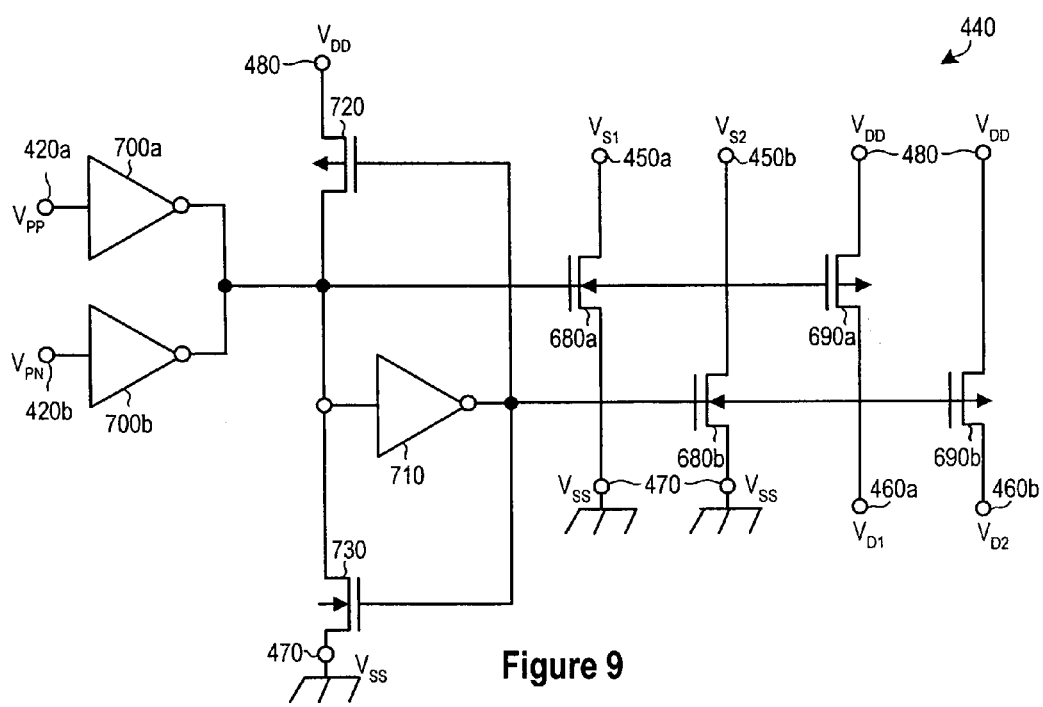
FIG. 9 is a schematic diagram of an embodiment of a voltage source control circuit in FIG. 4.

One embodiment of the switching voltage supply 440 of FIG. 4 is illustrated in FIG. 9. This embodiment of the switching voltage supply 440 comprises first and second switching NMOS transistors 680a, 680b, each of the transistors 680a, 680b having a gate, a source, and a drain. The drain of the first switching NMOS transistor 680a is coupled to the first low output terminal 450a. The drain of the second switching NMOS transistor 680b is coupled to the second low output terminal 450b. The sources of the first and second switching NMOS transistors 680a, 680b are coupled to the low voltage terminal 470 to receive the low voltage $V_{SS}$.

The switching voltage supply 440 of this embodiment also comprises first and second switching PMOS transistors 690a, 690b, each of the transistors 690a, 690b having a gate, a source, and a drain. The drain of the first switching PMOS transistor 690a is coupled to the first high output terminal 460a. The drain of the second switching PMOS transistor 690b is coupled to the second high output terminal 460b. The sources of the first and second switching PMOS transistors 690a, 690b are coupled to the high voltage terminal 480 to receive the high voltage $V_{DD}$.

First and second inverters 700a, 700b are also provided in this embodiment of the switching voltage supply 440. Each of the first and second inverters 700a, 700b comprises an input terminal and an output terminal. The output terminal of the first inverter 700a is coupled to the output terminal of the second inverter 700b and to the gates of the first switching NMOS transistor 680a and the first switching PMOS transistor 690a. The input terminal of the first inverter 700a is coupled to the first terminal 420a of the first pair of differential input terminals to receive the first input voltage $V_{PP}$, and the input terminal of the second inverter 700b is coupled to the second terminal 420b of the first pair of differential input terminals to receive the second input voltage $V_{PN}$.

The switching voltage supply 440 further comprises a third inverter 710 having an input terminal and an output terminal. The input terminal of the third inverter 710 is coupled to the output terminals of the first and second inverters 700a, 700b, and the output terminal of the third inverter 710 is coupled to the gates of the second switching NMOS transistor 680b and the second switching PMOS transistor 690b.

A load current control PMOS transistor 720 that has a gate, a source, and a drain is also provided. The source of the load current control PMOS transistor 720 is coupled to the high voltage terminal to receive the high voltage $V_{DD}$. The drain of the load current control PMOS transistor 720 is coupled to the output terminals of the first and second inverters 700a, 700b, and the gate of the load current control PMOS transistor 720 is coupled to the output terminal of the third inverter 710.

In addition, a load current control NMOS transistor 730 that has a gate, a source, and a drain is provided. The source of the load current control NMOS transistor 730 is coupled to the low voltage terminal to receive the low voltage $V_{SS}$. The drain of the load current control NMOS transistor 730 is coupled to the output terminals of the first and second inverters 700a, 700b, and the gate of the load current control NMOS transistor 730 is coupled to the output terminal of the third inverter 710.

In operation, when the values of the first pair of differential input voltages $V_{PP}$, $V_{PN}$ and the second pair of differential input voltages $V_{NP}$, $V_{NN}$ are higher than the higher threshold voltage that is determined by the first and second inverters 700a, 700b and the load current control PMOS transistor 720 of FIG. 9, the second low supply output terminal 450b is coupled to the low voltage terminal 470 to receive the low voltage $V_{SS}$, and the first high supply output terminal 460a is coupled to the high voltage terminal 480 to receive the high voltage $V_{DD}$. The current control NMOS transistors 560a-560d and the load current control PMOS transistors 550a, 550b are activated, and currents $I_{NPP}$, $I_{NPN}$, $I_{NNP}$, $I_{NNN}$ flow through the first, second, third, and fourth current control NMOS transistors 560a-560d, respectively, in magnitudes corresponding to the differential input voltages $V_{PP}$, $V_{PN}$, $V_{NP}$, $V_{NN}$, respectively.

Returning to FIG. 4, if the first and second load current control PMOS transistors 550a, 550b, the first and second voltage control PMOS transistor circuits 610a, 610b, and the first and second voltage control NMOS transistor circuits 620a, 620b have conductance that is greater than the conductance of the first, second, third, and fourth current control NMOS transistors 560a-560d, then the first and second current control NMOS transistors 560a, 560b have drain voltages $V_{DNP}$, $V_{DNN}$, respectively, at nodes 590c, 590d, respectively, that are held substantially constant, as shown by Equation 1:

$$V_{DNP}, V_{DNN} = V_{DD} - V_{thN} - |V_{thP}| - V_{DSP} \qquad (1)$$

where $V_{thP}$ is a threshold voltage of the PMOS transistors of the first and second voltage control PMOS transistor circuits 610a, 610b, $V_{thN}$ is a threshold voltage of the NMOS transistors of the first and second voltage control NMOS transistor circuits 620a, 620b, and $V_{DSP}$ is a drain-to-source voltage of the load current control PMOS transistors 550a, 550b. Since the conductance of the load current control PMOS transistors 550a, 550b is greater than the conductance of the current control NMOS transistors 560a-560d, $V_{DSP}$ is substantially small (i.e., $V_{DSP} \sim 0$).

If the drain voltages $V_{DNP}$, $V_{DNN}$ of the first and second current control NMOS transistors 560a, 560b are kept lower than the voltages $V_{PP} - V_{thN}$, $V_{PN} - V_{thN}$, $V_{NP} - V_{thN}$, $V_{NN} - V_{thN}$, the first, second, third, and fourth current control NMOS transistors 560a-560d operate in the triode (non-saturation) region, and the differences between the voltages of each of the pairs of differential input voltages ($V_{PP} - V_{PN}$ and $V_{NP} - V_{NN}$) result in a differential current $I_P - I_N$ that is proportional to the voltages $V_{PP} - V_{PN}$ and $V_{NP} - V_{NN}$, as shown by Equation 2:

$$I_P - I_N = G_1 \cdot (V_{DD} - V_{thN} - |V_{thP}| - V_{DSP})[(V_{PP} - V_{PN}) - (V_{NP} - V_{NN})] \qquad (2)$$

where $G_1$ is a constant. The differential current $I_P - I_N$ results in a differential output voltage $V_{CP} - V_{CN}$ that is approximately proportional to the differential current $I_P - I_N$. Thus, the differential voltage $V_{CP} - V_{CN}$ is given by Equation 3:

$$V_{CP} - V_{CN} = R \cdot (I_P - I_N) = R \cdot G_1 \cdot \qquad (3)$$
$$(V_{DD} - V_{thN} - |V_{thP}| - V_{DSN})[(V_{PP} - V_{PN}) - (V_{NP} - V_{NN})]$$

where R is a constant.

When the values of the first and second pairs of differential input voltages $V_{PP}$, $V_{PN}$, $V_{NP}$, $V_{NN}$ are lower than the lower threshold voltage that is determined by the first and second inverters 700a, 700b and the load current control NMOS transistor 730 of FIG. 9, then the first low output terminal 450a is coupled to the low voltage terminal 470 to receive the low voltage $V_{SS}$, the second high output terminal 460b is coupled to the high voltage terminal 480 to receive the high voltage $V_{DD}$, and the current control PMOS transistors 540a-540d and load current control NMOS transistors 570a, 570b are activated. Currents $I_{PPP}$, $I_{PPN}$, $I_{PNP}$, $I_{PNN}$ flow through the first, second, third, and fourth current control PMOS transistors 540a-540d, respectively, in magnitudes corresponding to the differential input voltages $V_{PP}$, $V_{PN}$, $V_{NP}$, $V_{NN}$, respectively. If the conductance of the first and second load current control NMOS transistors 570a, 570b, the first and second voltage control PMOS transistor circuits 610a, 610b, and the first and second voltage control NMOS transistor circuits 620a, 620b is greater than the conductance of the first, second, third, and fourth current control PMOS transistors 540a-540d, then the drain voltages $V_{DPP}$, $V_{DPN}$ of the first and second current control PMOS transistors 540a, 540b, respectively, at nodes 590a, 590b, respectively, are kept at substantially the same voltage, as shown by Equation 4:

$$V_{DPP}, V_{DPN} = V_{thN} + |V_{thP}| + V_{DSN} \tag{4}$$

where $V_{DSN}$ is a drain-to-source voltage of the load current control NMOS transistors 570a, 570b.

If the drain voltages $V_{DPP}$, $V_{DPN}$ of the first, second, third, and fourth current control PMOS transistors 540a-540d are kept higher than the voltages $V_{PP}+|V_{thP}|$, $V_{PN}+|V_{thP}|$, $V_{NP}+|V_{thP}|$, $V_{NN}+|V_{thP}|$, the first, second, third, and fourth current control PMOS transistors 540a-540d operate in the triode region, and the voltages $V_{PP}-V_{PN}$, $V_{NP}-V_{NN}$ result in a differential current $I_P-I_N$ that is approximately proportional to the difference between the two differential input voltages $V_{PP}-V_{PN}$ and $V_{NP}-V_{NN}$, as shown by Equation 5:

$$I_P-I_N = G_2 \cdot (V_{DD}-V_{thN}-|V_{thP}|-V_{DSN})[(V_{PP}-V_{PN})-(V_{NP}-V_{NN})] \tag{5}$$

where $G_2$ is a constant. This differential current $I_P-I_N$ results in a differential output voltage $V_{CP}-V_{CN}$ that is proportional to the differential current $I_P-I_N$. Thus, the difference between the differential output voltages ($V_{CP}-V_{CN}$) is given by Equation 6:

$$V_{CP} - V_{CN} = R_2 \cdot (I_P - I_N) = R_2 \cdot G_2 \cdot \tag{6}$$
$$(V_{DD} - V_{thN} - |V_{thP}| - V_{DSN})[(V_{PP} - V_{PN}) - (V_{NP} - V_{NN})]$$

where $R_2$ is a constant.

Thus, the DDA 410 is able to operate effectively across a desirably wide common mode range (CMR). This wide CMR can be advantageous in applications that require a wide input range. For example, the DDA 410 may have improved performance across a wide input range in an application of the DDA 410 in an LVDS receiver, as described in more detail below.

Since the drain-to-source voltages $V_{DSP}$, $V_{DSN}$ of the load current control PMOS transistors 550a, 550b and the load current control NMOS transistors 570a, 570b, respectively, can be relatively small, and if the drain-to-source voltages of the current control PMOS transistors 540a-540d and the current control NMOS transistors 560a-560d are also relatively small, the high voltage $V_{DD}$ is substantially near the sum of the threshold voltage $V_{thN}$ of the NMOS transistors of the voltage control NMOS transistor circuits 620a, 620b and the threshold voltage $|V_{thP}|$ of the PMOS transistors of the voltage control PMOS transistor circuits 610a, 610b, as consistent with Equation 7:

$$V_{DD} > V_{thN} + |V_{thP}| \tag{7}$$

Thus, the DDA 410 is able to operate at desirably low levels of the high voltage $V_{DD}$. The current through the current control transistors 540a-540d, 560a-560d in the DDA 410 is limited by the voltage control transistor circuits 610a, 610b, 620a, 620b and by the load current control transistors 550a, 550b, 570a, 570b. Even if the high voltage $V_{DD}$ is increased, the total current consumption of the DDA 410 can be maintained at a substantially constant and low level by maintaining the voltage to the load current control PMOS transistors 550a, 550b from the first output terminal 500 of the first bias regulator 490.

Moreover, the DDA 410 may be manufactured without the need for special analog circuit parts, such as a band gap reference circuit or precision capacitors or resistors. In addition, the individual electronic components of the DDA 410 can be manufactured according to conventional CMOS logic manufacturing processes.

Figure 10:
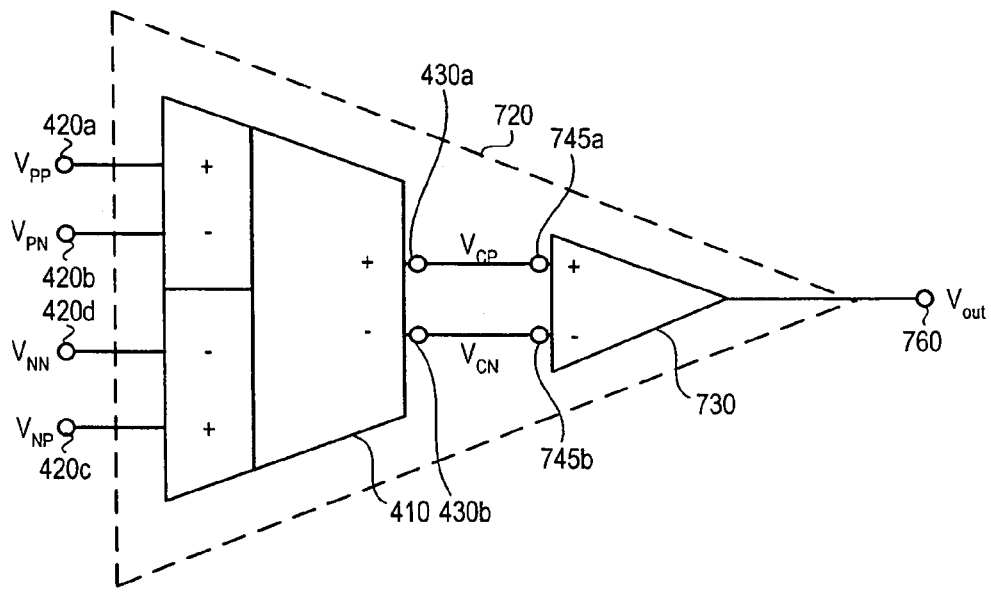
FIG. 10 is a schematic diagram of an embodiment of a single output DDA that includes a DDA and a single output operational amplifier (op-amp)

In one version, as illustrated in the schematic diagram of the exemplary embodiment in FIG. 10, a single output DDA 720 comprises the DDA 410 and a single output operational amplifier 730 that has first and second input terminals 745a, 745b. The first and second terminals 430a, 430b of the pair of differential output terminals of the DDA 410 are coupled to the first and second input terminals 745a, 745b, respectively, of the single output op-amp 730.

Figure 11:
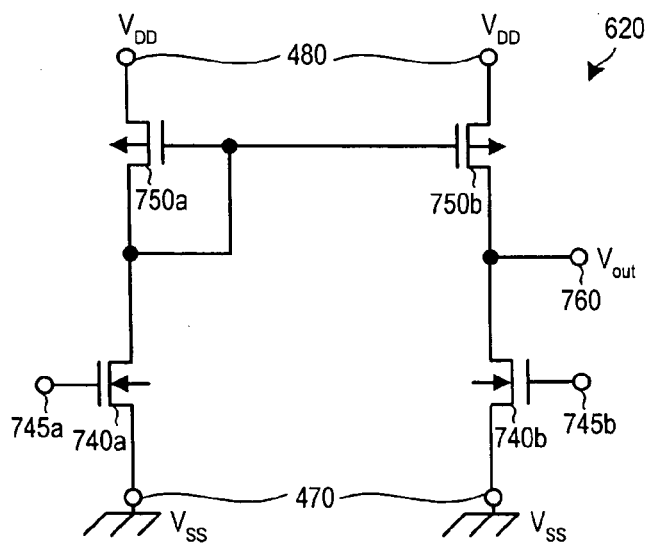
FIG. 11 is a schematic diagram of an embodiment of a single output op-amp in FIG. 10.

FIG. 11 is a schematic diagram of an exemplary embodiment of the single output op-amp 730 in the single output DDA 720 of FIG. 10. The single output op-amp 730 comprises first and second NMOS transistors 740a, 740b. First and second PMOS transistors 750a, 750b are also provided. Each of the NMOS and PMOS transistors comprises a gate, a source, and a drain. The sources of the first and second NMOS transistors 740a, 740b are coupled to the low voltage terminal 470 to receive the low voltage $V_{SS}$, such as the electrical ground shown in FIG. 11. The sources of the first and second PMOS transistors 750a, 750b are coupled to the high voltage terminal 480 to receive the high voltage $V_{DD}$. The drain of the first NMOS transistor 740a is coupled to the drain of the first PMOS transistor 750a and to the gates of the first and second PMOS transistors 750a, 750b. The gate of the second NMOS transistor 740b is coupled to a second input terminal 745b of the single output op-amp 730. The gate of the first NMOS transistor 740a is coupled to a first input terminal 745a of the single output op-amp 730. The drains of the second NMOS transistor 740b and the second PMOS transistor 750b are coupled to a single-ended output 760 of the single output op-amp 730, as shown in FIG. 11.

Figure 12:
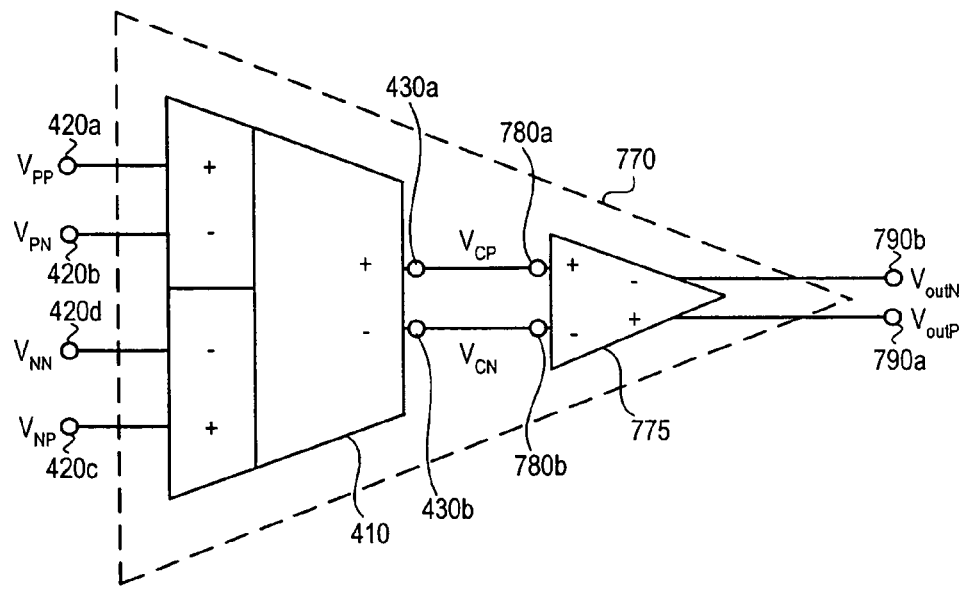
FIG. 12 is a schematic diagram of an embodiment of a differential output DDA that includes a DDA and a differential output op-amp.

In another version, as illustrated in the schematic diagram of the exemplary embodiment in FIG. 12, a differential output DDA 770 comprises the DDA 410 and a differential output op-amp 775. The differential output op-amp 775 comprises first and second input terminals 780a, 780b. The first and second terminals 430a, 430b of the pair of differential output terminals of the DDA 410 are coupled to the first and second input terminals 780a, 780b, respectively, of the differential output op-amp 775.

Figure 13:
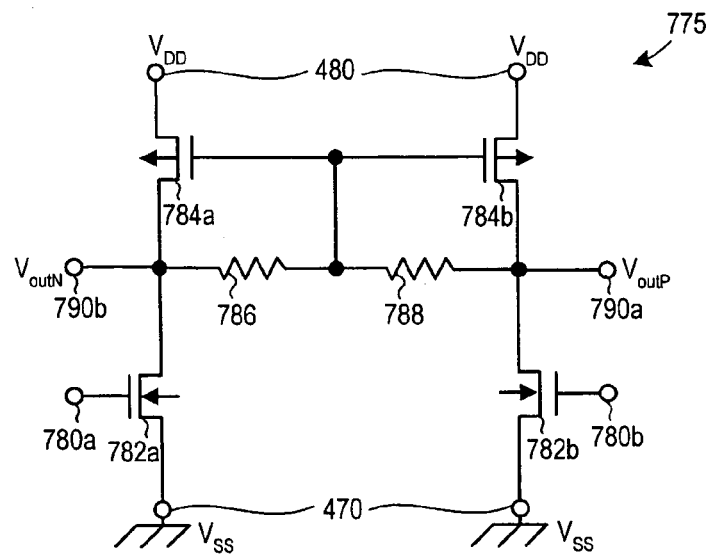
FIG. 13 is a schematic diagram of an embodiment of a differential output op-amp in FIG. 12.

FIG. 13 is a schematic diagram of an exemplary embodiment of the differential output op-amp 775 in the differential output DDA 770. The differential output op-amp 775 comprises first and second NMOS transistors 782a, 782b. First and second PMOS transistors 784a, 784b are also provided. The individual NMOS and PMOS transistors comprise a gate, a source, and a drain. The differential output op-amp 775 further comprises first and second resistors 786, 788, the individual resistors having a first terminal and a second terminal.

The sources of the first and second NMOS transistors 782a, 782b are coupled to the low voltage terminal 470 to receive the low voltage $V_{SS}$, such as the electrical ground shown in FIG. 13. The sources of the first and second PMOS transistors 784a, 784b are coupled to the high voltage terminal 480 to receive the high voltage $V_{DD}$. The second terminal of the first resistor 786 is coupled to the first terminal of the second resistor 788 and to the gates of the first and second PMOS transistors 784a, 784b. The gate of the first NMOS transistor 782a is coupled to the first input terminal 780a of the differential output op-amp 775. The gate of the second NMOS transistor 782b is coupled to the second input terminal 780b of the differential output op-amp 775. The drain of the first NMOS transistor 782a is coupled to the drain of the first PMOS transistor 784a, to the first terminal of the first resistor 786, and to a second terminal 790b of a pair of amplified differential output terminals. The drain of the second NMOS transistor 782b is coupled to the drain of the second PMOS transistor 784b, to the second terminal of the second resistor 788, and to a first terminal 790a of the pair of amplified differential output terminals.

Figure 14:
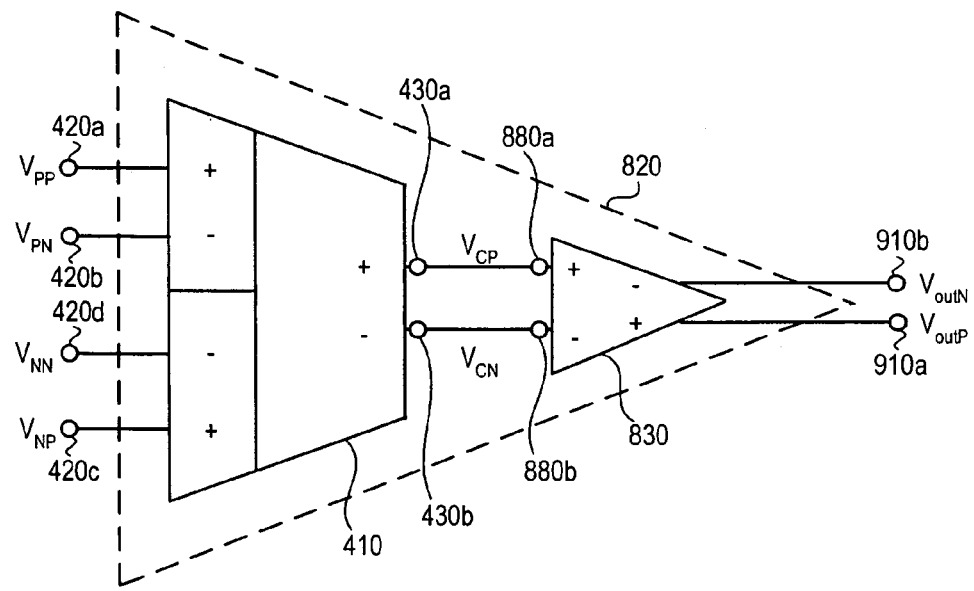
FIG. 14 is a schematic diagram of an embodiment of a differential difference comparator that includes a DDA and a differential output comparator.

In yet another version, as illustrated in the schematic diagram of the exemplary embodiment of FIG. 14, a differential output differential difference comparator 820 comprises the DDA 410 and a differential output comparator 830. The differential output comparator 830 comprises first and second input terminals 880a, 880b, and first and second terminals 910a, 910b of a pair of comparator differential output terminals. The first and second terminals 430a, 430b of the pair of differential output terminals of the DDA 410 are respectively coupled to the first and second input terminals 880a, 880b of the differential output comparator 830.

Figure 15:
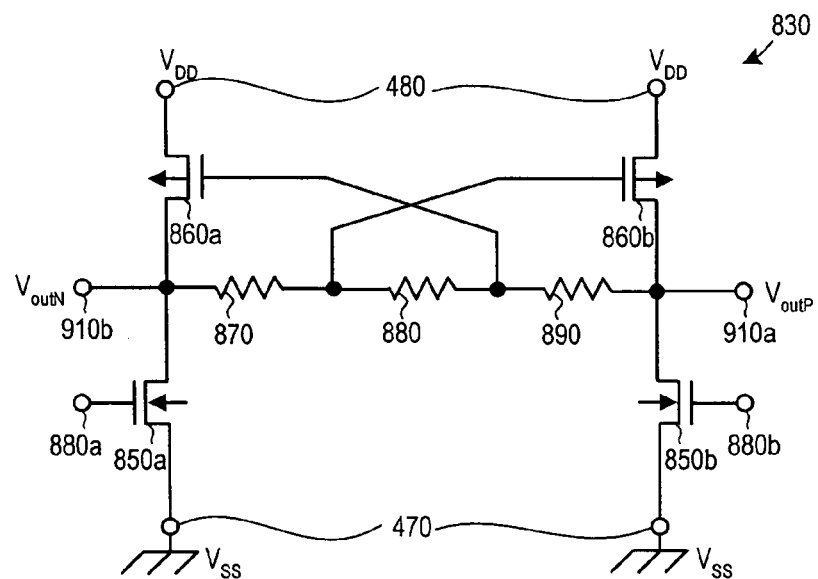
FIG. 15 is a schematic diagram of an embodiment of a differential output comparator in FIG. 14.

FIG. 15 is a schematic diagram of an exemplary embodiment of the differential output comparator 830 in the differential output differential difference comparator 820 of FIG. 14. The differential output comparator 830 comprises first and second NMOS transistors 850a, 850b. First and second PMOS transistors 860a, 860b are also provided. The individual transistors 850a, 850b, 860a, 860b comprise a gate, a source, and a drain. First, second, and third resistors 870, 880, 890 are also provided. The individual resistors comprise a first terminal and a second terminal.

The sources of the first and second NMOS transistors 850a, 850b are coupled to the low voltage terminal 470 to receive the low voltage $V_{SS}$, such as the electrical ground shown in FIG. 15. The sources of the first and second PMOS transistors 860a, 860b are coupled to the high voltage terminal 480 to receive the high voltage $V_{DD}$. The second terminal of the first resistor 870 and the first terminal of the second resistor 880 are coupled to the gate of the second PMOS transistor 860b. The second terminal of the second resistor 880 and the first terminal of the third resistor 890 are coupled to the gate of the first PMOS transistor 860a. The gate of the first NMOS transistor 850a is coupled to the first input terminal 880a of the differential output comparator 830. The gate of the second NMOS transistor 850b is coupled to the second input terminal 880b of the differential output comparator 830. The drain of the first NMOS transistor 850a is coupled to the drain of the first PMOS transistor 860a, to the first terminal of the first resistor 870, and to the second terminal 910b of the pair of comparator differential output terminals. The drain of the second NMOS transistor 850b is coupled to the drain of the second PMOS transistor 860b, to the second terminal of the third resistor 890, and to the first terminal 910a of the pair of comparator differential output terminals.

Figure 16:
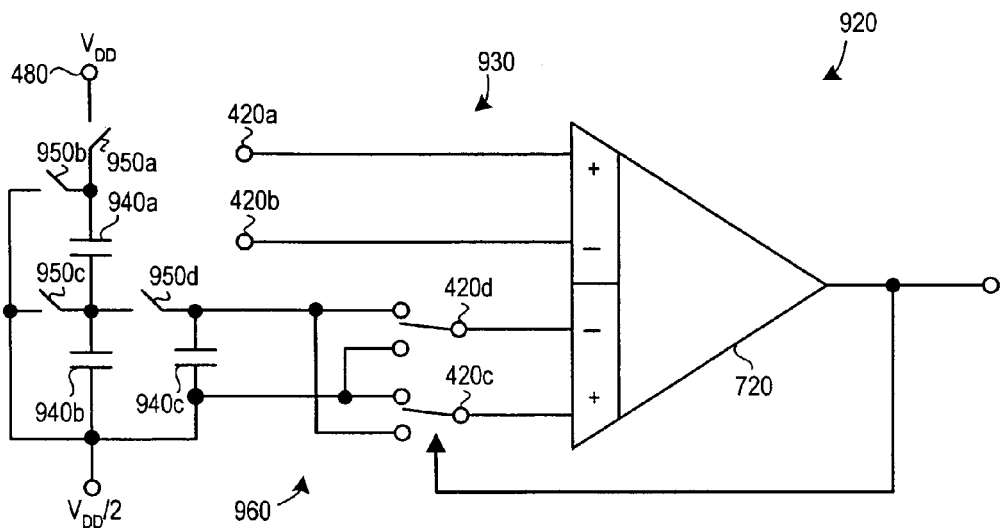
FIG. 16 is a schematic diagram of an embodiment of an LVDS receiver having a single output DDA.

FIG. 16 is a schematic diagram of an exemplary embodiment of a differential receiver 920 comprising a single-output DDA such as the DDA 720 shown in FIG. 10. The differential receiver 920 comprises an offset voltage generator 930. The offset voltage generator 930 comprises first, second, and third capacitors 940a-940c, each of the capacitors having a first terminal and a second terminal. First, second, third, and fourth switches 950a-950d are also provided, the individual switches having a first terminal and a second terminal. The first terminal of the first switch 950a is coupled to the high voltage terminal 480 to receive the high voltage $V_{DD}$. The second terminal of the first switch 950a is coupled to the first terminal of the first capacitor 940a and to the second terminal of the second switch 950b. The first terminal of the second switch 950b is coupled to the first terminal of the third switch 950c, to the second terminal of the second capacitor 940b, to the second terminal of the third capacitor 940c, and to a voltage $V_{DD}/2$ of approximately half the voltage level as the high voltage $V_{DD}$. The second terminal of the third switch 950c is coupled to the second terminal of the first capacitor 940a, to the first terminal of the second capacitor 940b, and to the first terminal of the fourth switch 950d. The second terminal of the fourth switch 950d is coupled to the first terminal of the third capacitor 940c.

A differential voltage selector 960 is provided to selectively couple, to the first and second terminals 420c, 420d of the second pair of differential input terminals of the single-output DDA 720, (i) the first and the second terminals, respectively, of the third capacitor 940c, or (ii) the second and the first terminals, respectively, of the third capacitor 940c, depending on the output of the single-output DDA 720. For example, the differential voltage selector 960 may comprise an additional pair of switches, as shown in FIG. 16.

Figure 17:
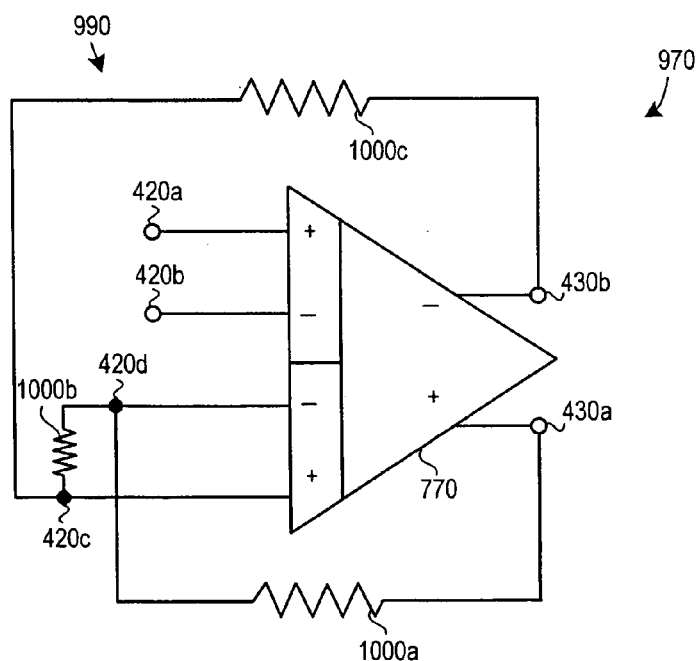
FIG. 17 is a schematic diagram of an embodiment of a LVDS receiver having a differential output DDA.

FIG. 17 is a schematic diagram of another exemplary embodiment of a differential receiver 970 comprising a differential output DDA such as the differential output DDA 770 shown in FIG. 12. Another exemplary embodiment of an offset voltage generator 990 is adapted to generate offset voltages that are applied to the reference voltage input of the differential output DDA 770.

The offset voltage generator comprises first, second, and third resistors 1000a-1000c, each of the resistors 1000a-1000c having first and second terminals. The first terminal of the first resistor 1000a is coupled to the first terminal 430a of the pair of differential output terminals of the differential output DDA 770. The second terminal of the first resistor 1000a is coupled to the first terminal of the second resistor 1000b and to the second terminal 420d of the second pair of differential input terminals of the differential output DDA 770. The second terminal of the second resistor 1000b is coupled to the first terminal of the third resistor 1000c and to the first terminal 420c of the second pair of differential input terminals of the differential output DDA 770. The second terminal of the third resistor 1000c is coupled to the second terminal 430b of the pair of differential output terminals of the differential output DDA 770.

Figure 18:
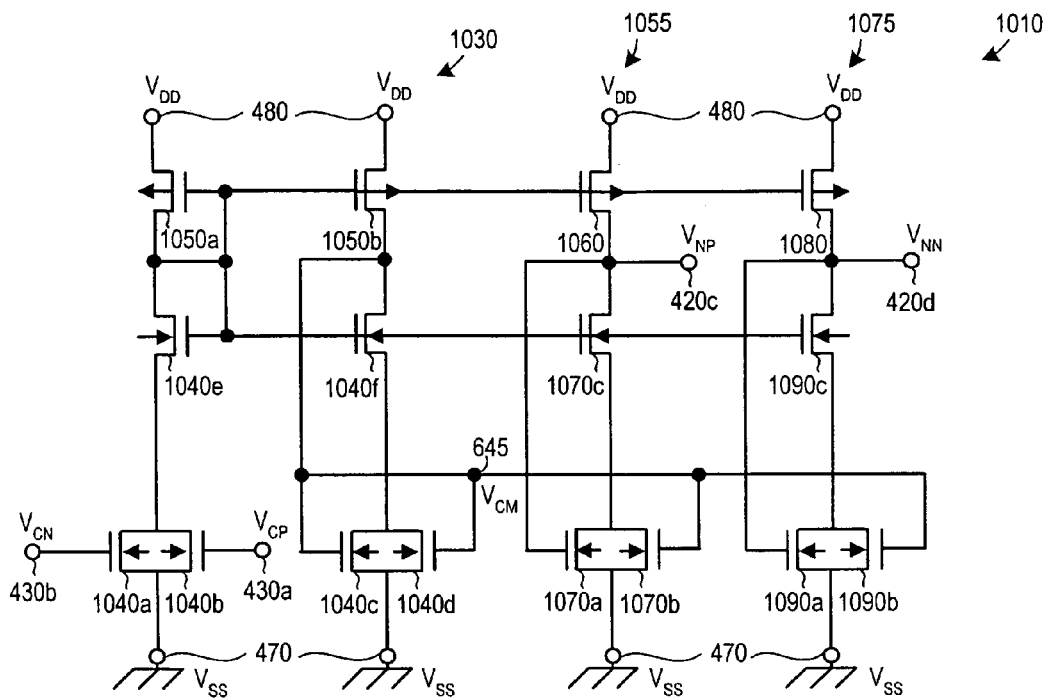
FIG. 18 is a schematic diagram of an embodiment of a small offset voltage circuit that is adapted to generate a pair of offset voltages.

FIG. 18 is a schematic diagram of yet another exemplary embodiment of an offset voltage generator 1010 that is adapted to supply reference offset voltages that are applied to the first and second terminals 420c, 420d of the second pair of differential input terminals of the DDA 410 to form a differential receiver.

The offset voltage generator 1010 comprises a center voltage generator 1030 that comprises first, second, third, fourth, fifth, and sixth NMOS transistors 1040a-1040f, the individual transistors having a gate, a source, and a drain. The sources of the first, second, third, and fourth NMOS transistors 1040a-1040d are coupled to the low voltage terminal 470 to receive the low voltage $V_{SS}$. The drains of the first and second NMOS transistors 1040a, 1040b are coupled to the source of the fifth NMOS transistor 1040e.

The drains of the third and fourth NMOS transistors 1040c, 1040d are coupled to the source of the sixth NMOS transistor 1040f. The gate of the first NMOS transistor 1040a is coupled to the second terminal of the pair of differential output terminals 430b. The gate of the second NMOS transistor 1040b is coupled to the first terminal of the pair of differential output terminals 430a.

The center voltage generator 1030 further comprises first and second PMOS transistors 1050a, 1050b, the individual transistors having a gate, a source, and a drain. The drain of the fifth NMOS transistor 1040e is coupled to the gate of the fifth NMOS transistor 1040e, to the gate of the sixth NMOS transistor 1040f, to the drain of the first PMOS transistor 1050a, and to the gates of the first and second PMOS transistors 1050a, 1050b. The gate of the third NMOS transistor 1040c is coupled to the gate of the fourth NMOS transistor 1040d, to the drain of the sixth NMOS transistor 1040f, and to the drain of the second PMOS transistor 1050b. The sources of the first and second PMOS transistors are coupled to the high voltage terminal 480 to receive the high voltage $V_{DD}$. The center voltage $V_{CM}$ of the differential output voltages $V_{CP}$ and $V_{CN}$ is provided at the drain of the sixth NMOS transistor 1040f.

The offset voltage generator 1010 further comprises a first offset voltage circuit 1055 that comprises a PMOS transistor 1060 having a gate, a source, and a drain. First, second, and third NMOS transistors 1070a-1070c are also provided, the individual transistors having a gate, a source, and a drain. The source of the PMOS transistor 1060 is coupled to the high voltage $V_{DD}$. The gate of the PMOS transistor 1060 is coupled to the gate of the second PMOS transistor 1050b of the center voltage generator 1030. The drain of the third NMOS transistor 1070c is coupled to the drain of the PMOS transistor 1060, to the gate of the first NMOS transistor 1070a, and to the first terminal 420c of the second pair of differential input terminals of the DDA 410. The gate of the second NMOS transistor 1070b is coupled to the gate of the fourth NMOS transistor 1040d of the center voltage generator 1030 to receive the center voltage $V_{CM}$ at node 645. The gate of the third NMOS transistor 1070c is coupled to the gate of the sixth NMOS transistor 1040f of the center voltage generator 1030.

The offset voltage generator 1010 further comprises a second offset voltage circuit 1075 that comprises a PMOS transistor 1080 having a gate, a source, and a drain. The gate of the PMOS transistor 1080 is coupled to the gate of the PMOS transistor 1060 of the first offset voltage circuit 1055 and to the gate of the second PMOS transistor 1050b of the center voltage generator 1030. The source of the PMOS transistor 1080 is coupled to the high voltage $V_{DD}$. First, second, and third NMOS transistors 1090a-1090c are also provided, the individual transistors having a gate, a source, and a drain. The drain of the third NMOS transistor 1090c is coupled to the drain of the PMOS transistor 1080, to the gate of the first NMOS transistor 1090a, and to the second terminal 420d of the second pair of differential input terminals of the DDA 410. The gate of the second NMOS transistor 1090b is coupled to the gate of the second NMOS transistor 1070b of the first offset voltage circuit 1055. The gate of the third NMOS transistor 1090c is coupled to the gate of the third NMOS transistor 1070c of the first offset voltage circuit 1055.

The first, second, third, and fourth NMOS transistors 1040a-1040d of the center voltage generator 1030, and the second NMOS transistors 1070b, 1090b of the first and second offset voltage circuits 1055, 1075, may have substantially the same electrical characteristics. The first NMOS transistor 1070a of the first offset voltage circuit 1055 may have a smaller conductance than that of the second NMOS transistor 1070b. The first NMOS transistor 1090a of the second offset voltage circuit 1075 may have a greater conductance than that of the second NMOS transistor 1090b.

The fifth and sixth NMOS transistors 1040e, 1040f of the center voltage generator 1030 and the third NMOS transistors 1070c, 1090c of the first and second offset voltage circuits 1055, 1075 may have substantially the same electrical characteristics. The first and second PMOS transistors 1050a, 1050b of the center voltage generator 1030 and the PMOS transistors 1060, 1080 of the first and second voltage offset circuits 1055, 1075 may have substantially the same electrical characteristics.

If an offset voltage generator 930, 990, 1010, such as those illustrated in the exemplary embodiments of FIGS. 16, 17, and 18, respectively, is used, the output voltage ($V_{out}$ for single output; $V_{out}=V_{outP}-V_{outN}$ for differential output) of each of the LVDS receivers 920, 970, 1010 respectively described in relation to those Figures is adapted to have a hysteresis voltage $V_h$ with respect to the difference between the first and second differential input voltages ($V_{in}=V_{PP}-V_{PN}$). The hysteresis voltage $V_h$ is given at a node between the two terminals 420c, 420d of the offset voltage generators 930, 990, 1010. The hysteresis voltage $V_h$ may be $V_h=V_{NP}-V_{NN}$.

Figure 19:
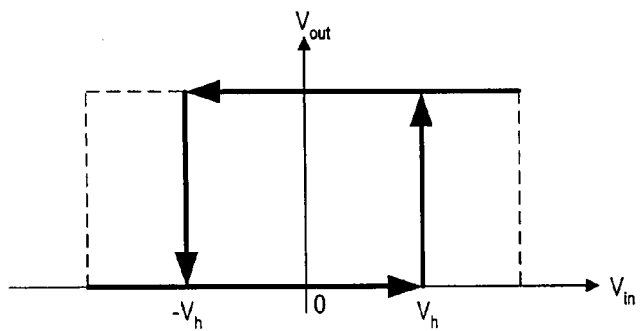
FIG. 19 is a graph showing a plot of an output voltage of the LVDS receivers of FIGS. 16 and 17, as a function of input voltage.

FIG. 19 is a graph showing a plot of output voltage ($V_{out}$) as a function of input voltage difference ($V_{in}$), as the input voltage difference increases toward a higher threshold voltage ($V_h$), crosses the higher threshold voltage, returns to a lower threshold voltage ($-V_h$), and crosses the lower threshold voltage.

Figure 20:
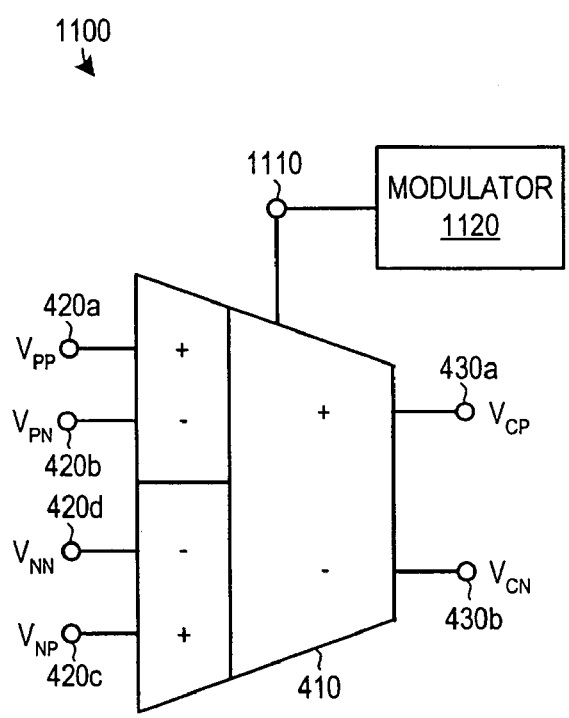
FIG. 20 is a schematic diagram of a DDA that has a gain modulation input, and a modulator coupled to the gain modulation input of the DDA.

FIG. 20 is a schematic diagram of a DDA 1100 comprising a gain modulation input terminal 1110 to which a modulator 1120 can apply a modulated signal to the DDA 410 to modulate the output signal ($V_{CP}$, $V_{CN}$). As shown in Equations (3) or (6), the gain of the DDA 410 can be modulated by the high voltage $V_{DD}$ from the power supply and the drain-to-source voltages $V_{DSP}$, $V_{DSN}$ of the load current control transistors 550a, 550b, 570a, 570b. The drain-to-source voltages $V_{DSP}$, $V_{DSN}$ of the load current control transistors 550a, 550b, 570a, 570b can be controlled by the first and second output terminals 500, 510 of the first bias regulator 490. For example, the modulator 1120 may apply the modulated signal to the second bias output terminal 510 of the first bias regulator 490, shown in FIG. 4, to modulate the output signal ($V_{CP}$, $V_{CN}$) at the differential output terminals 430a, 430b.

Figure 21:
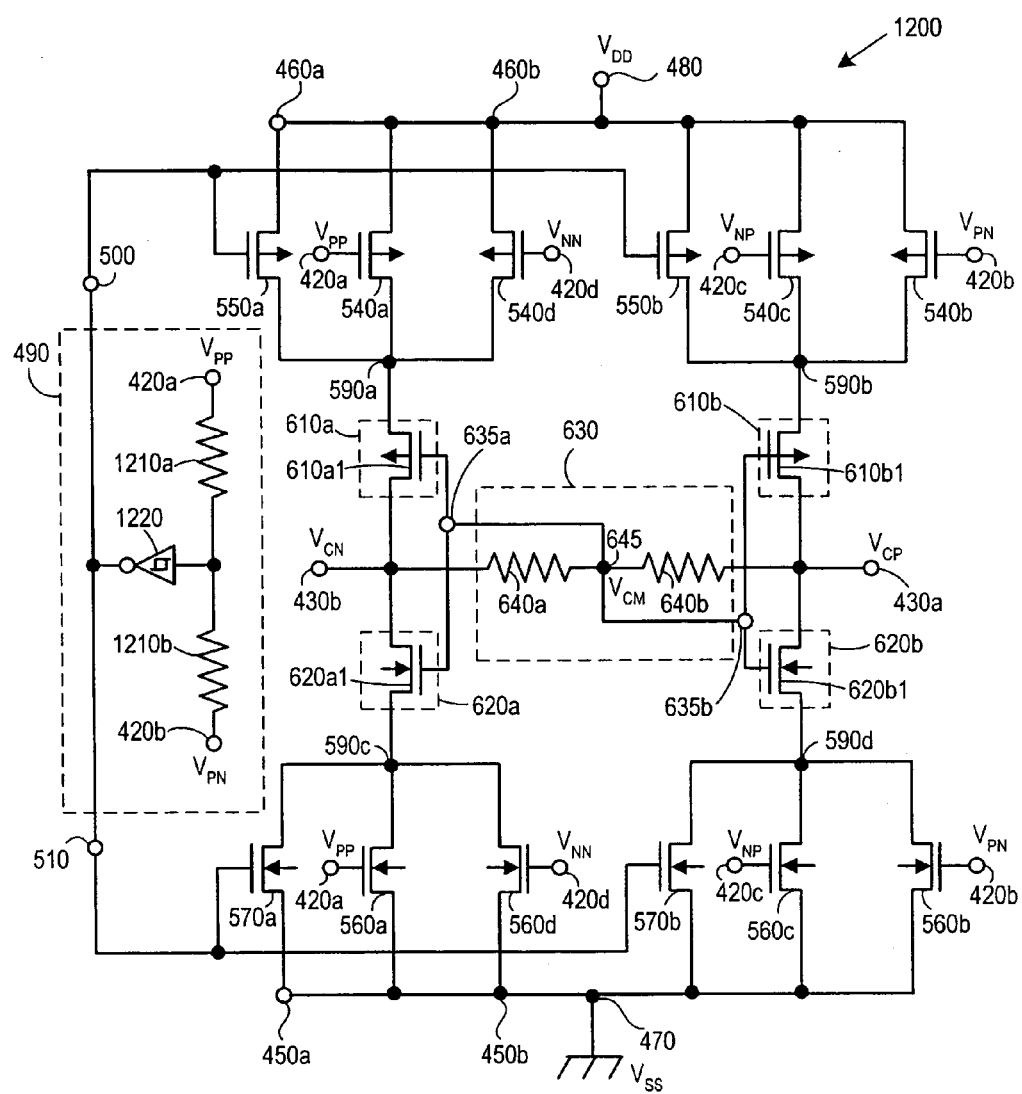
FIG. 21 is a schematic diagram of another embodiment of a DDA.

FIG. 21 is a schematic diagram of another embodiment of a DDA 1200. In this embodiment, the sources of the first, second, third, and fourth current control PMOS transistors 540a-540d and the sources of the first and second load current control PMOS transistors 550a, 550b are coupled to the high voltage terminal 480 to receive the high voltage $V_{DD}$. The sources of the first, second, third, and fourth current control NMOS transistors 560a-560d and the first and second load current control NMOS transistors 570a, 570b are coupled to the low voltage terminal 470 to receive the low voltage $V_{SS}$.

The first bias regulator 490 comprises first and second resistors 1210a, 1210b, each of the resistors 1210a, 1210b having a first terminal and a second terminal. A Schmitt inverter 1220 is also provided that has an input terminal and an output terminal. The second terminal of the first resistor 1210a is coupled to the second terminal of the second resistor 1210b and to the input terminal of the Schmitt inverter 1220. The output terminal of the Schmitt inverter 1220 is coupled to the first and second output terminals 500, 510 of the first bias regulator 490. The input terminal of the first resistor 1210a is coupled to the first terminal 420a of the first pair of differential input terminals to receive the first input voltage $V_{PP}$, while the input terminal of the second resistor 1210b is coupled to the second terminal 420b of the first pair of differential input terminals to receive the second input voltage $V_{PN}$.

When the first and second pairs of differential input voltages $V_{PP}$, $V_{PN}$, $V_{NP}$, $V_{NN}$ are higher than the higher threshold voltage of the Schmitt inverter 1220 of the first bias regulator 490, the Schmitt inverter 1220 outputs a low voltage. As a result, the load current control PMOS transistors 550a, 550b are turned on and the load current control NMOS transistors 570a, 570b are turned off. If the load current control PMOS transistors 550a, 550b have conductance that is sufficiently higher than conductance of the current control NMOS transistors 560a-560d, the drain-to-source voltage $V_{DSP}$ of the load current control PMOS transistors 550a, 550b is relatively small. Thus, the current through the current control PMOS transistors 540a-540d is sufficiently smaller than the current through the current control NMOS transistors 560a-560d that the current through the current control PMOS transistors 540a-540d can be neglected for the purposes of approximate calculations. The difference between the differential output voltages ($V_{CP}$–$V_{CN}$) can be approximated by Equation 3 provided above.

Similarly, when the first and second pairs of differential input voltages $V_{PP}$, $V_{PN}$, $V_{NP}$, $V_{NN}$ are lower than the lower threshold voltage of the Schmitt inverter 1220 of the first bias regulator 490, the Schmitt inverter 1220 outputs a high voltage. As a result, the load current control PMOS transistors 550a, 550b are turned off and the load current control NMOS transistors 570a, 570b are turned on. If the conductance of the load current control NMOS transistors 570a, 570b is sufficiently higher than the conductance of the current control PMOS transistors 540a-540d, the drain-to-source voltage $V_{DSN}$ of the load current control NMOS transistors 570a, 570b is relatively small. Thus, the current through the current control NMOS transistors 560a-560d is sufficiently smaller than the current through the current control PMOS transistors 540a-540d that the current through the current control NMOS transistors 560a-560d can be neglected for the purposes of approximate calculations. The difference between the differential output voltages ($V_{CP}$–$V_{CN}$) can be approximated by Equation 6 provided above, showing that the DDA 1200 operates as desired.

The DDA 1200 of FIG. 21 may be advantageous in certain applications because it may occupy a smaller physical area, such as a smaller area of a silicon substrate, than other differential difference amplifiers. For example, the DDA 1200 of FIG. 21 may occupy a smaller area than the DDA 410 of FIG. 4 because the first and second resistors 1210a, 1210b and the Schmitt inverter 1220 of the DDA 1200 replace the first bias regulator 490 and switching voltage supply 440 of the DDA 410.

Figure 22:
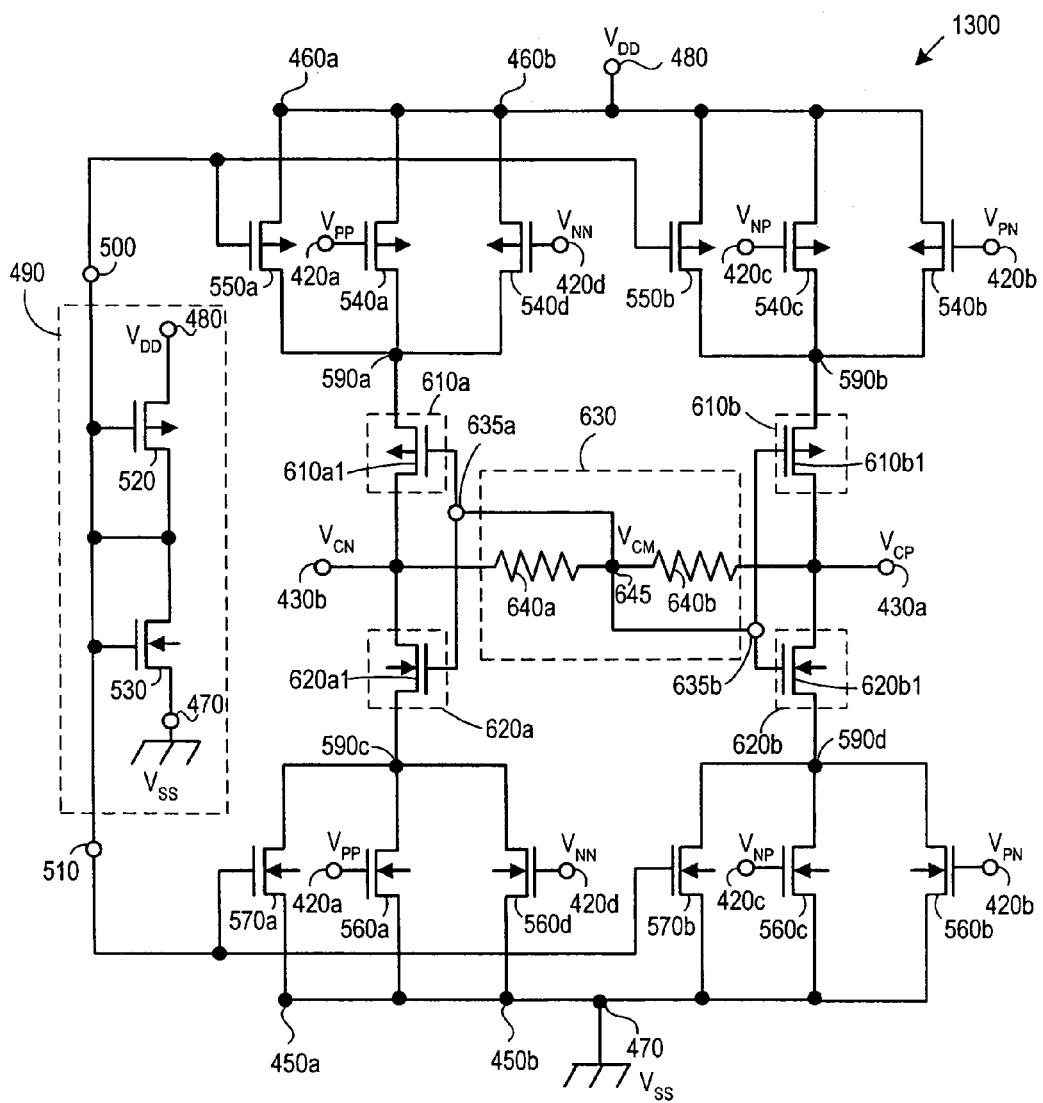
FIG. 22 is a schematic diagram of yet another embodiment of a DDA.

FIG. 22 is a schematic diagram of another embodiment of a DDA 1300. In this embodiment, the sources of the first, second, third, and fourth current control PMOS transistors 540a-540d and the sources of the first and second load current control PMOS transistors 550a, 550b are coupled to the high voltage terminal 480 to receive the high voltage $V_{DD}$. The sources of the first, second, third, and fourth current control NMOS transistors 560a-560d and the sources of the first and second load current control NMOS transistors 570a, 570b are coupled to the low voltage terminal 470 to receive the low voltage $V_{SS}$.

The source of the PMOS transistor 520 of the first bias regulator 490 is coupled to the high voltage terminal 480 to receive the high voltage $V_{DD}$. The drain and the gate of the PMOS transistor 520 are coupled to the first output terminal 500 of the first bias regulator 490. The source of the NMOS transistor 530 of the first bias regulator 490 is coupled to the low voltage terminal 470 to receive the low voltage $V_{SS}$. The drain and the gate of the NMOS transistor 530 are coupled to the drain of the PMOS transistor 520 and to the second output terminal 510 of the first bias regulator 490. The gates of the first and second load current control PMOS transistors 550a, 550b of the DDA 1300 are coupled to the first output terminal 500 of the first bias regulator 490, and the gates of the first and second load current control NMOS transistors 570a, 570b are coupled to the second output terminal 510 of the first bias regulator 490.

In operation, the first and second load current control PMOS transistors 550a, 550b and the first and second load current control NMOS transistors 570a, 570b supply a substantially constant current over time. The current control PMOS transistors 540a-540d and the current control NMOS transistors 560a-560d are turned on substantially concurrently. If the drain-to-source voltage $V_{DSP}$ of the load current control PMOS transistors 550a, 550b and the drain-to-source voltage $V_{DSN}$ of the load current control NMOS transistors 570a, 570b are selected to be small, then the center voltage $V_{CM}$ (at node 645) of the differential output voltages $V_{CP}$, $V_{CN}$ approaches the threshold voltage $V_{thN}$ of the voltage control NMOS transistors 620a, 620b, and the high voltage $V_{DD}$ approaches the sum of the threshold voltages ($V_{thN}$+|$V_{thP}$|), as shown by Equations 8 and 9:

$$V_{CM}=V_{thN}+\Delta \qquad (8)$$

$$V_{DD}=V_{thN}+|V_{thP}|+\Delta \qquad (9)$$

where $\Delta$ is a relatively small value.

When the first and second pairs of differential input voltages $V_{PP}$, $V_{PN}$, $V_{NP}$, $V_{NN}$ are higher than the center voltage $V_{CM}$ (at node 645), of the differential output voltages $V_{CP}$, $V_{CN}$, then the current control PMOS transistors 540a-540d are turned off and the current control NMOS transistors 560a-560d operate in the triode region. Thus, the difference between the differential output voltages ($V_{CP}$–$V_{CN}$) is given by Equation 10:

$$V_{CP}-V_{CN}=R \cdot G_1 \cdot V_{DSN}[(V_{PP}-V_{PN})-(V_{NP}-V_{NN})] \qquad (10)$$

When the first and second pairs of differential input voltages $V_{PP}$, $V_{PN}$, $V_{NP}$, $V_{NN}$ are lower than the center voltage $V_{CM}$ (at node 645), of the differential output voltages $V_{CP}$, $V_{CN}$, then the current control NMOS transistors 560a-560d are turned off and the current control PMOS transistors 540a-540d operate in the triode region. Thus, the difference between the differential output voltages ($V_{CP}$–$V_{CN}$) is given by Equation 11:

$$V_{CP}-V_{CN}=R \cdot G_2 \cdot V_{DSP}[(V_{PP}-V_{PN})-(V_{NP}-V_{NN})] \qquad (11)$$

Thus, the DDA 1300 operates as desired.

If the second pair of differential inputs $V_{NP}$, $V_{NN}$ are fixed near the center voltage $V_{CM}$, the third and fourth current control PMOS transistors 540c, 540d and the third and fourth current control NMOS transistors 560c, 560d are turned on and operate in the triode region substantially concurrently. Since the first and second load current control PMOS transistors 550a, 550b and the first and second load current control NMOS transistors 570a, 570b are turned on substantially concurrently, the first pair of differential inputs $V_{PP}$, $V_{PN}$ can change from values near $V_{SS}$ to values near $V_{DD}$, while the second pair of differential inputs $V_{NP}$, $V_{NN}$ are fixed near the center voltage $V_{CM}$. Without a voltage switching supply such as the voltage switching supply 440 of FIG. 4 or a Schmitt inverter such as the Schmitt inverter 1220 of FIG. 21, there is not a transition region between two threshold voltages, and the operation of the DDA 1300 is continuous throughout a substantially wide common mode input range.

Figure 23:
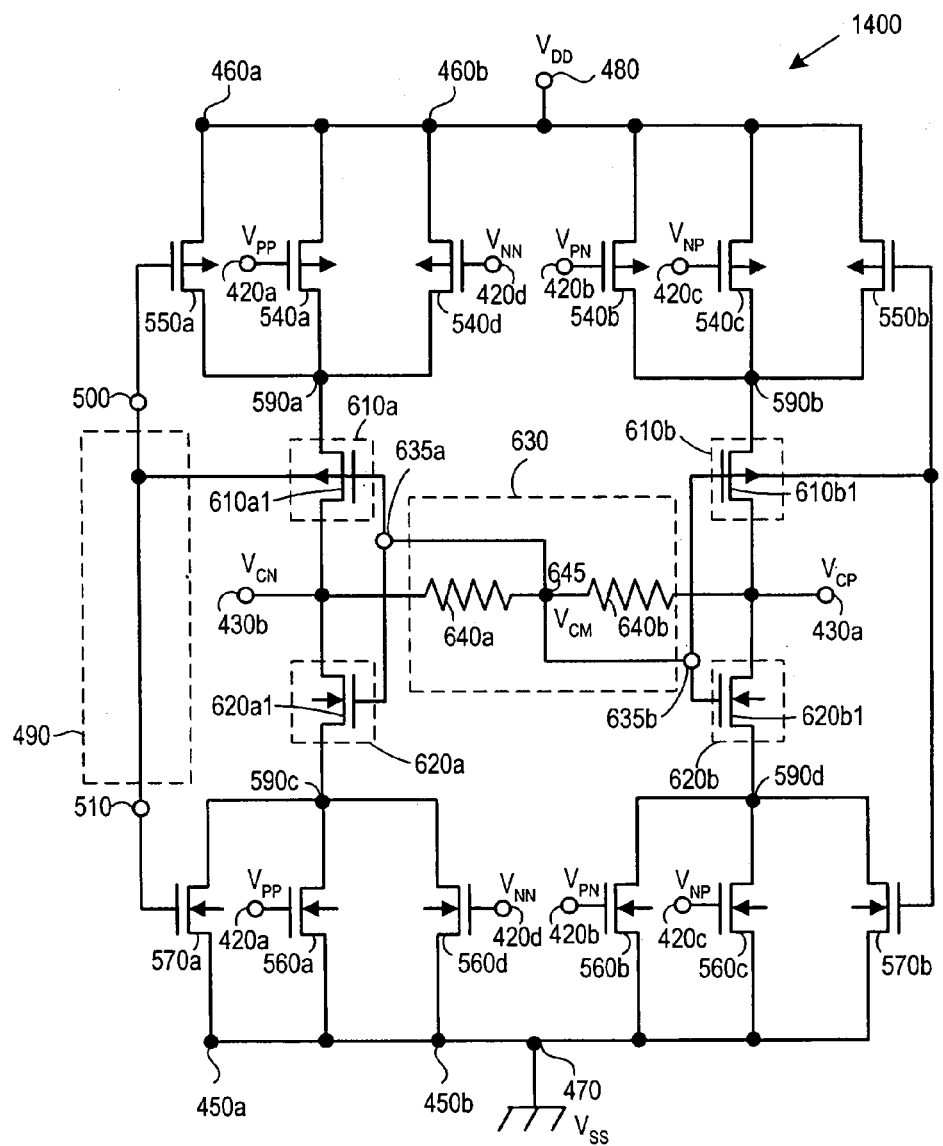
FIG. 23 is a schematic diagram of yet another embodiment of a DDA.

FIG. 23 is a schematic diagram of yet another embodiment of a DDA 1400. In this embodiment, the sources of the first, second, third, and fourth current control PMOS transistors 540a-540d and the sources of the first and second load current control PMOS transistors 550a, 550b are coupled to the high voltage terminal 480 to receive the high voltage $V_{DD}$. The sources of the first, second, third, and fourth current control NMOS transistors 560a-560d and the sources of the first and second load current control NMOS transistors 570a, 570b are coupled to the low voltage terminal 470 to receive the low voltage $V_{SS}$.

The first bias regulator 490 does not contain any individual electronic components. Rather, the first bias regulator 490 in this embodiment comprises a coupling of the first output terminal 500 of the first bias regulator 490 to the second output terminal 510 of the first bias regulator 490 and to the first output terminal 635a of the second bias regulator 630. Thus, the gate of the first load current control PMOS transistor 550a and the gate of the first load current control NMOS transistor 570a are coupled to the first output terminal 635a of the second bias regulator 630. In addition, the gate of the second load current control PMOS transistor 550b and the gate of the second load current control NMOS transistor 570b are coupled to the second output terminal 635b of the second bias regulator 630.

In operation, the first, second, third, and fourth current control PMOS transistors 540a-540d, the first, second, third, and fourth current control NMOS transistors 560a-560d, the first and second load current control PMOS transistors 550a, 550b, and the first and second load current control NMOS transistors 570a, 570b are turned on at substantially the same time as the same transistors in the DDA 1300 of FIG. 22. If the drain-to-source voltage $V_{DSP}$ of the first and second load current control PMOS transistors 550a, 550b and the drain-to-source voltage $V_{DSN}$ of the first and second load current control NMOS transistors 570a, 570b are selected to be small, then the center voltage $V_{CM}$ (at node 632) of the differential output voltages $V_{CP}$, $V_{CN}$ is substantially close to the threshold voltage $V_{thN}$, and the high voltage $V_{DD}$ is substantially close to the sum of the threshold voltages $V_{thN}$, $|V_{thp}|$, as shown by Equations 12 and 13:

$$V_{CM} = V_{thN} + \Delta \quad (12)$$

$$V_{DD} = V_{thN} + V_{thP} + \Delta \quad (13)$$

When the first pair of differential input voltages $V_{PP}$, $V_{PN}$ are higher than the center voltage $V_{CM}$, the first and second current control NMOS transistors 560a, 560b operate in the triode region, while the first and second current control PMOS transistors 540a, 540b are turned off. When the first pair of differential input voltages $V_{PP}$, $V_{PN}$ are lower than the center voltage $V_{CM}$, the first and second current control PMOS transistors 540a, 540b operate in the triode region, while the first and second current control NMOS transistors 560a, 560b are turned off.

When the second pair of differential input voltages $V_{NP}$, $V_{NN}$ are near the center voltage $V_{CM}$, the third and fourth current control PMOS transistors 540c, 540d and the third and fourth NMOS transistors 560c, 560d are turned on and operate in the triode region.

When the voltages at the first and second output terminals 635a, 635b of the second bias regulator 630 are substantially the same as the center voltage $V_{CM}$ at node 645, as shown in FIG. 23, the currents through the first and the second load current control PMOS transistors 550a, 550b are of substantially the same magnitude, and the currents through the first and the second load current control NMOS transistors 570a, 570b are of substantially the same magnitude. Under these conditions, the DDA 1400 of FIG. 23 operates similarly to the DDA 1300 of FIG. 22.

However, when the second bias regulator 630 of FIG. 8 is used in the DDA 1400 of FIG. 23, the voltage at the first output terminal 635a and the voltage at the second output terminal 635b of the second bias regulator 630 are different. This voltage difference induces a difference between the current through the first load current PMOS transistor 550a and the current through the second load current PMOS transistor 550b, together with a difference between the current through the first load current NMOS transistor 570a and the current through the second load current NMOS transistor 570b, and these differences result in a positive feedback to the differential output voltages $V_{CP}$, $V_{CN}$. Under these conditions, the DDA 1400 operates with increased gain as a differential difference comparator.

By use of the voltage control PMOS transistor circuits 610a, 610b and the voltage control NMOS transistor circuits 620a, 620b, as well as the load current control PMOS transistors 550a, 550b and the load current control NMOS transistors 570a, 570b, the common mode voltage of the first and second output terminals 635a, 635b of the second bias regulator 630 results in a negative feedback to the center voltage $V_{CM}$, while the positive differential voltage between the first and the second output terminals 635a, 635b of the second bias regulator 630 results in a positive feedback to the differential output terminals $V_{CP}$, $V_{CN}$. Thus, the DDA 1400 may have a more stable center voltage and a greater gain as a differential difference comparator.

Furthermore, since the first bias regulator 490 of the DDA 1400 of FIG. 23 does not contain any electronic components, the DDA 1400 can be fabricated to be advantageously small. For example, the DDA 1400 can be formed on a desirably small area of silicon.

Figure 24:
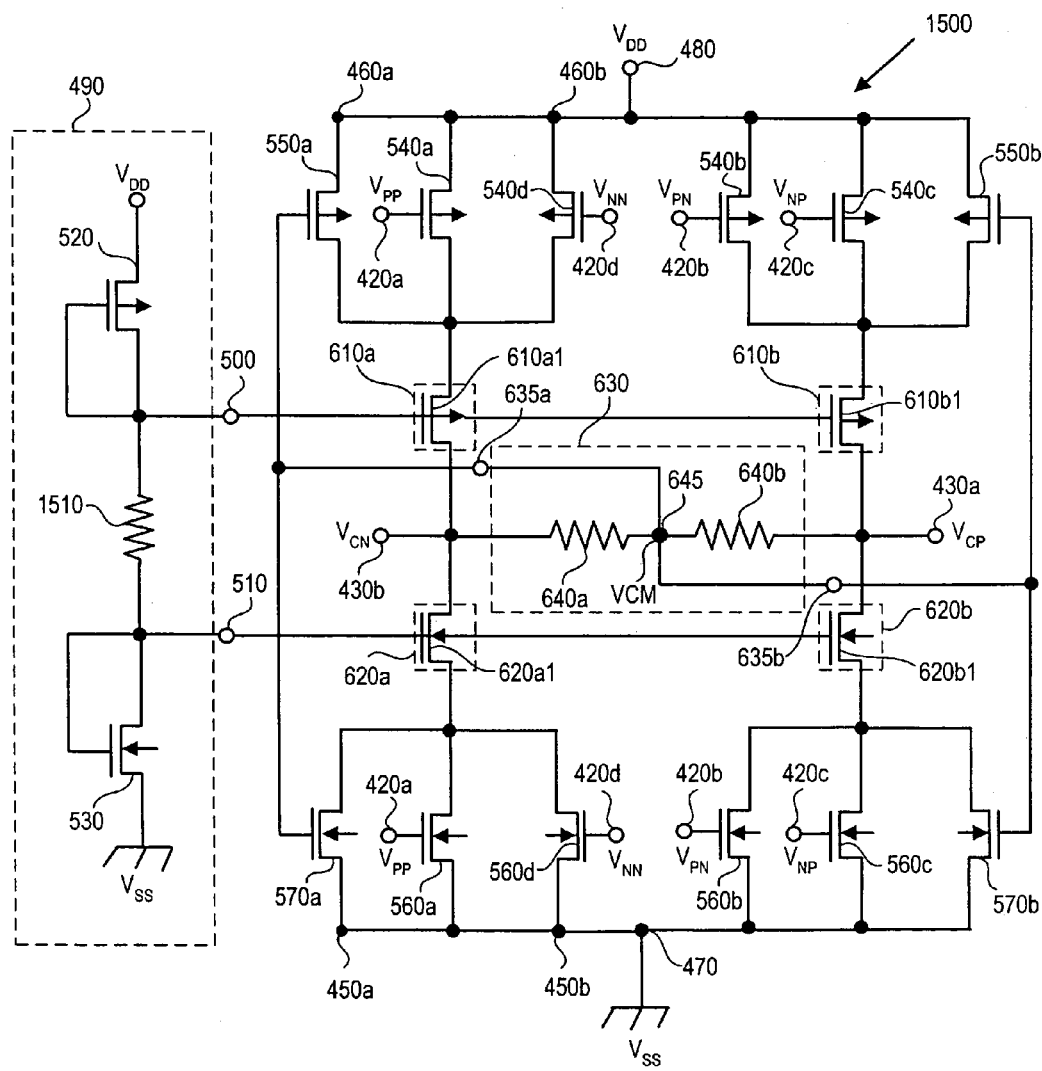
FIG. 24 is a schematic diagram of yet another embodiment of a DDA.

FIG. 24 is a schematic diagram of another embodiment of a DDA 1500. In this embodiment, the sources of the first, second, third, and fourth current control PMOS transistors 540a-540d and the sources of the first and second load current control PMOS transistors 550a, 550b are coupled to the high voltage terminal 480 to receive the high voltage $V_{DD}$. The sources of the first, second, third, and fourth current control NMOS transistors 560a-560d and the sources of the first and second load current control NMOS transistors 570a, 570b are coupled to the low voltage terminal 470 to receive the low voltage $V_{SS}$.

The source of the PMOS transistor 520 of the first bias regulator 490 is coupled to the high voltage terminal 480 to receive the high voltage $V_{DD}$. The drain and the gate of the PMOS transistor 520 are coupled to the first output terminal 500 of the first bias regulator 490. The source of the NMOS transistor 530 of the first bias regulator 490 is coupled to the low voltage terminal 470 to receive the low voltage $V_{SS}$. The drain and the gate of the NMOS transistor 530 are coupled to the second output terminal 510 of the first bias regulator 490. The drains of the PMOS transistor 520 and the NMOS transistor 530 are coupled to a resistor 1510. The first output terminal 500 of the first bias regulator 490 is coupled to the gate terminals of the first and second voltage control PMOS transistor circuits 610a, 610b, and the second output terminal 510 of the first bias regulator 490 is coupled to the gate terminals of the first and second voltage control NMOS transistor circuits 620a, 620b.

The gates of the first load current control PMOS transistor 550a and the first load current control NMOS transistor 570a of the DDA 1500 are coupled to the first output terminal 635a of the second bias regulator 630. The gates of the second load current control PMOS transistor 550b and the second load current control NMOS transistor 570b are coupled to the second output terminal 635b of the second bias regulator 630.

In operation, if the drain-to-source voltage $V_{DSP}$ of the load current control PMOS transistors 550a, 550b and the drain-to-source voltage $V_{DSN}$ of the load current control NMOS transistors 570a, 570b are selected to be small by selecting the voltages at the first and second output terminals of the first bias regulator 490, then the center voltage $V_{CM}$ (at node 645) of the differential output voltages $V_{CP}$, $V_{CN}$ is kept around $V_{DD}/2$, and the first and second load current control PMOS transistors 550a, 550b and the first and second load current control NMOS transistors 570a, 570b are turned on and supply a substantially constant current over time. The current control PMOS transistors 540a-540d and the current control NMOS transistors 560a-560d are turned on substantially concurrently and operate in the triode region.

As the voltages at the gate terminals of the voltage control PMOS transistor circuits 610a, 610b and the gate terminals of the voltage control NMOS transistor circuits 620a, 620b are kept substantially constant in a wide range of $V_{DD}$, the current control PMOS transistors 540a-540d and the current control NMOS transistors 560a-560d operate in the triode region in a wide range of $V_{DD}$.

Figure 25:
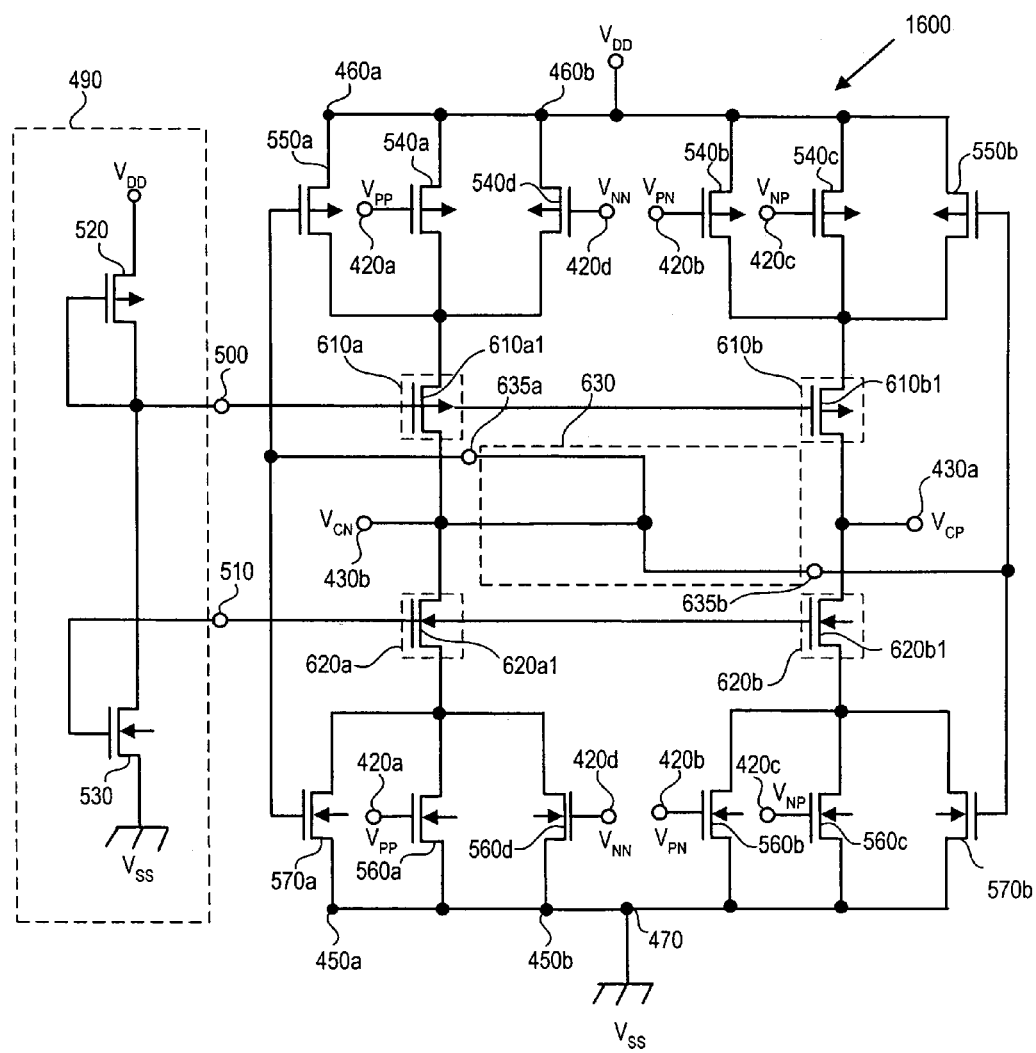
FIG. 25 is a schematic diagram of yet another embodiment of a DDA.

FIG. 25 is a schematic diagram of another embodiment of a DDA 1600. In comparison to the DDA 1500 of FIG. 24, the first bias regulator 490 of DDA 1500 is the first bias regulator 490 shown in FIG. 4. The second bias regulator 630 is the second bias regulator 630 of FIG. 7 to have a single output. The absence of a resistor in the circuitry of the DDA 1500 may permit easier implementation using standard logic processes.

Figure 26:
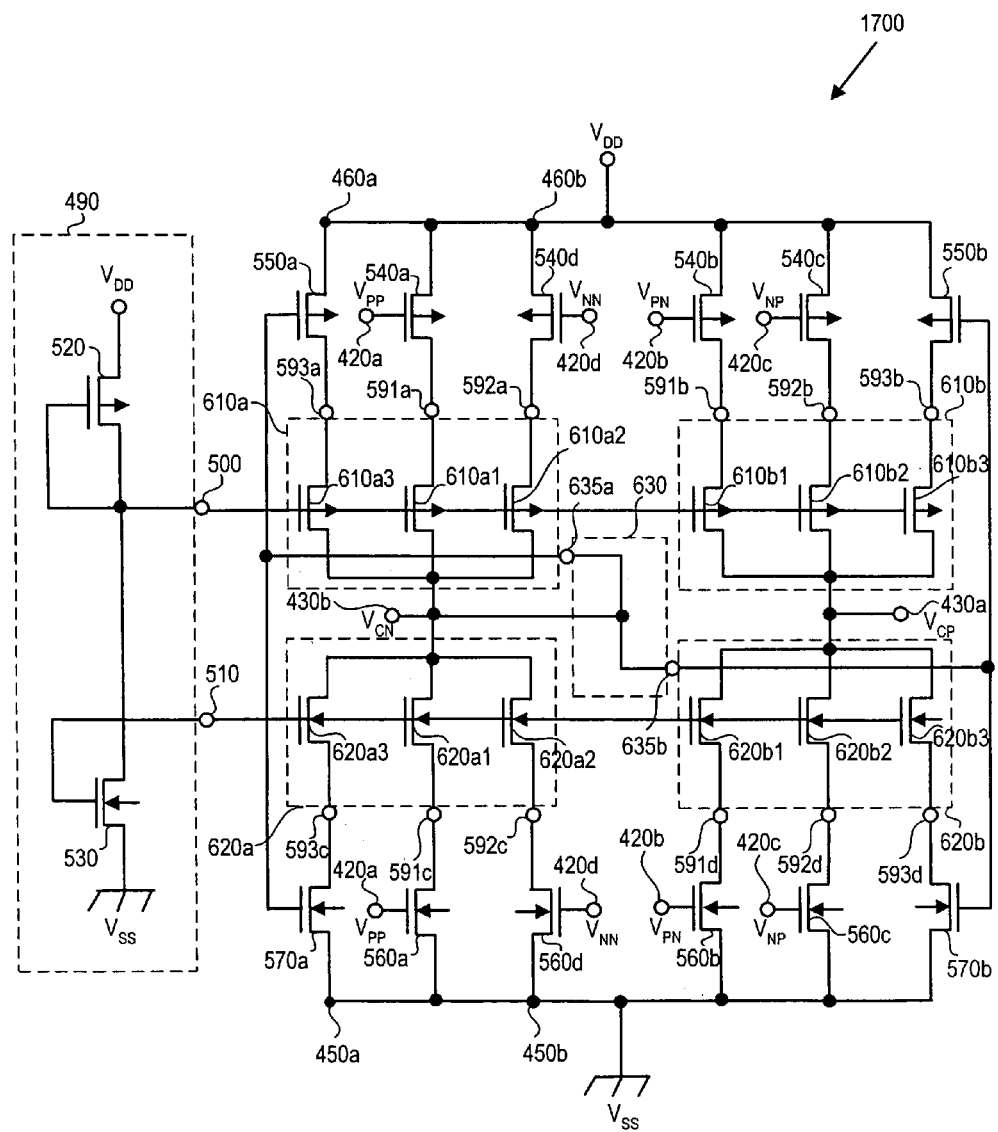
FIG. 26 is a schematic diagram of yet another embodiment of a DDA.

FIG. 26 is a schematic diagram of yet another embodiment of a DDA 1700. In comparison to the DDA 1600 of FIG. 25, the voltage control PMOS transistor circuits 610a, 610b and the voltage control NMOS transistor circuits 620a, 620b respectively comprise three PMOS transistors (shown as PMOS transistors 610a1-610a3, 610b1-610b3) and three NMOS transistors (shown as NMOS transistors 620a1-620a3, 620b1-620b3). The sources of the first PMOS transistors 610a1, 610b1 of the first and second voltage control PMOS transistor circuits 610a, 610b are coupled to the drains of the first and second current control PMOS transistors 540a, 540b, respectively. The sources of the second PMOS transistors 610a2, 610b2 of the first and second voltage control PMOS transistor circuits 610a, 610b are coupled to the drains of the fourth and third current control PMOS transistors 540d, 540c, respectively. The sources of the third PMOS transistors 610a3, 610b3 of the first and second voltage control PMOS transistor circuits 610a, 610b are coupled to the drains of the first and second load current control PMOS transistors 550a, 550b, respectively.

The sources of the first NMOS transistors 620a1, 620b1 of the first and second voltage control NMOS transistor circuits 620a, 620b are coupled to the drains of the first and second current control NMOS transistors 560a, 560b, respectively. The sources of the second NMOS transistors 620a2, 620b2 of the first and second voltage control NMOS transistor circuits 620a, 620b are coupled to the drains of the fourth and third current control NMOS transistors 560d, 560c, respectively. The sources of the third NMOS transistors 620a3, 620b3 of the first and second voltage control NMOS transistor circuits 620a, 620b are coupled to the drains of the first and second load current control NMOS transistors 570a, 570b, respectively. Since the first and second load current control PMOS transistors 550a, 550b and the current control PMOS transistors 540a-540d are isolated by the PMOS transistors 610a1-610a3, 610b1-610b3 of the first and second voltage control PMOS transistor circuits 610a, 610b, the DDA 1700 may be more stable as the differential input voltages are varied.

Although embodiments consistent with the present invention have been described in considerable detail with regard to embodiments thereof, other versions are possible. For example, the individual electronic components of the DDA 410 may comprise other electronic structures equivalent in function to the illustrative structures herein. Furthermore, relative or positional terms, such as "first," "second," "third," and "fourth" are used with respect to the exemplary embodiments and are interchangeable. Therefore, the appended claims should not be limited to the description of the versions contained herein.

What is claimed is:

1. A differential difference amplifier comprising:

first and second low supply output terminals and first and second high supply output terminals, one or more of the first and second low supply output terminals and one or more of the first and second high supply output terminals being coupled to a low voltage terminal and a high voltage terminal, respectively;

a first bias regulator comprising a first output terminal to supply a first bias voltage and a second output terminal to supply a second bias voltage;

a second bias regulator comprising first and second output terminals;

first, second, third, and fourth current control PMOS transistors each having a gate, a source, and a drain, the sources being coupled to one another and to the second high supply output terminal, the gates of the first and second current control PMOS transistors being coupled to first and second terminals of a first pair of differential input terminals, respectively, and the gates of the third and fourth current control PMOS transistors being coupled to first and second terminals of a second pair of differential input terminals, respectively;

first and second load current control PMOS transistors each having a gate, a source, and a drain, the sources being coupled to the first high supply output terminal, and the gates of the first and second load current control PMOS transistors being coupled to the first output terminal of the first bias regulator;

first, second, third, and fourth current control NMOS transistors each having a gate, a source, and a drain, the sources being coupled to each other and to the second low supply output terminal, the gates of the first and second current control NMOS transistors being coupled to the first and second terminals of the first pair of differential input terminals, respectively, and the gates of the third and fourth current control NMOS transistors being coupled to the first and second terminals of the second pair of differential input terminals, respectively;

first and second load current control NMOS transistors each having a gate, a source, and a drain, the sources being coupled to the first low supply output terminal, and the gates being coupled to the second output terminal of the first bias regulator;

first and second voltage control PMOS transistor circuits each having a gate terminal, at least one source terminal, and a drain terminal, the at least one source terminal of the first voltage control PMOS transistor circuit being coupled to the drains of the first and fourth current control PMOS transistors and to the drain of the first load current control PMOS transistor, the at least one source terminal of the second voltage control PMOS transistor circuit being coupled to the drains of the second and third current control PMOS transistors and to the drain of the second load current control PMOS transistor, the gate terminal of the first voltage control PMOS transistor circuit being coupled to the first output terminal of the second bias regulator, and the gate terminal of the second voltage control PMOS transistor circuit being coupled to the second output terminal of the second bias regulator; and first and second voltage control NMOS transistor circuits each having a gate terminal, at least one source terminal, and a drain terminal, the at least one source terminal of the first voltage control NMOS transistor circuit being coupled to the drains of the first and fourth current control NMOS transistors and to the drain of the first load current control NMOS transistor, the at least one source terminal of the second voltage control NMOS transistor circuit being coupled to the drains of the second and third current control NMOS transistors and to the drain of the second load current control NMOS transistor, the gate terminal of the first voltage control NMOS transistor circuit being coupled to the first output terminal of the second bias regulator, and the gate terminal of the second voltage control NMOS transistor circuit being coupled to the second output terminal of the second bias regulator, the drain terminals of the second voltage control PMOS transistor circuit and the second voltage control NMOS transistor circuit being coupled to a first terminal of a pair of differential output terminals, and the drain terminals of the first voltage control PMOS transistor circuit and the first voltage control NMOS transistor circuit being coupled to a second terminal of the pair of differential output terminals.

2. A differential difference amplifier according to claim 1, further comprising a switching voltage supply capable of selectively coupling, to the low voltage terminal and the high voltage terminal, either (i) the first low supply output terminal and the second high supply output terminal, respectively, or (ii) the second low supply output terminal and the first high supply output terminal, respectively.

3. A differential difference amplifier according to claim 2, wherein the switching voltage supply comprises:

first and second switching NMOS transistors each having a gate, a source, and a drain, the drain of the first switching NMOS transistor being coupled to the first low output terminal, the drain of the second switching NMOS transistor being coupled to the second low output terminal, and the sources of the first and second switching NMOS transistors for coupling to the low voltage terminal;

first and second switching PMOS transistors each having a gate, a source, and a drain, the drain of the first switching PMOS transistor being coupled to the first high output terminal, the drain of the second switching PMOS transistor being coupled to the second high output terminal, and the sources of the first and second switching PMOS transistors for coupling to the high voltage terminal;

first and second inverters each having an input terminal and an output terminal, the output terminal of the first inverter being coupled to the output terminal of the second inverter and to the gates of the first switching NMOS transistor and the first switching PMOS transistor, the input terminal of the first inverter being coupled to the first terminal of the first pair of differential input terminals, and the input terminal of the second inverter being coupled to the second terminal of the first pair of differential input terminals;

a third inverter having an input terminal and an output terminal, the input terminal being coupled to the output terminals of the first and second inverters, and the output terminal of the third inverter being coupled to the gates of the second switching NMOS transistor and the second switching PMOS transistor;

a load current control PMOS transistor having a gate, a source, and a drain, the source for coupling to the high voltage terminal, the drain being coupled to the output terminals of the first and second inverters, and the gate being coupled to the output terminal of the third inverter; and a load current control NMOS transistor having a gate, a source, and a drain, the source for coupling to the low voltage terminal, the drain being coupled to the output terminals of the first and second inverters, and the gate being coupled to the output terminal of the third inverter.

4. A differential difference amplifier according to claim 1, wherein the sources of the first, second, third, and fourth current control PMOS transistors and the sources of the first and second load current control PMOS transistors are coupled to the high voltage terminal, and the sources of the first, second, third, and fourth current control NMOS transistors and the first and second load current control NMOS transistors are coupled to the low voltage terminal.

5. A differential difference amplifier according to claim 1, wherein the second bias regulator comprises:

a first resistor having a first terminal and a second terminal, the first terminal being coupled to the second terminal of the pair of differential output terminals; and a second resistor having a first terminal and a second terminal, the first terminal being coupled to the second terminal of the first resistor and to the first and second output terminals of the second bias regulator, and the second terminal of the second resistor being coupled to the first terminal of the pair of differential output terminals.

6. A differential difference amplifier according to claim 4, wherein the first and second resistors of the second bias regulator have substantially the same electrical resistance.

7. A differential difference amplifier according to claim 1, wherein the second bias regulator comprises:

first, second, third, fourth, fifth, and sixth NMOS transistors each having a gate, a source, and a drain, the sources of the first, second, third, and fourth NMOS transistors for coupling to the low voltage terminal, the drains of the first and second NMOS transistors being coupled to the source of the fifth NMOS transistor, the drains of the third and fourth NMOS transistors being coupled to the source of the sixth NMOS transistor, the gate of the first NMOS transistor being coupled to the second terminal of the pair of differential output terminals, and the gate of the second NMOS transistor being coupled to the first terminal of the pair of differential output terminals; and first and second PMOS transistors each having a gate, a source, and a drain, the drain of the fifth NMOS transistor being coupled to the gate of the fifth NMOS transistor, to the gate of the sixth NMOS transistor, to the drain of the first PMOS transistor, and to the gates of the first and second PMOS transistors, the drain of the sixth NMOS transistor being coupled to the drain of the second PMOS transistor, the gate of the third NMOS transistor being coupled to the gate of the fourth NMOS transistor, to the drain of the sixth NMOS transistor, and to the first and second output terminals of the second bias regulator, and the sources of the first and second PMOS transistors for coupling to the high voltage terminal.

8. A differential difference amplifier according to claim 1, wherein the gates of the first and second voltage control NMOS transistors and the first and second voltage control PMOS transistors are coupled to the second terminal of the pair of differential output terminals.

9. A differential difference amplifier according to claim 1, wherein the second bias regulator comprises:

first, second, and third resistors each having a first terminal and a second terminal, the second terminal of the first resistor being coupled to the first terminal of the second resistor and to the gate terminals of the second voltage control PMOS transistor circuit and of the second voltage control NMOS transistor circuit, the second terminal of the second resistor being coupled to the first terminal of the third resistor and to the gate terminals of the first voltage control PMOS transistor circuit and of the first voltage control NMOS transistor circuit, the first terminal of the first resistor being coupled to the second terminal of the pair of differential output terminals, and the second terminal of the third resistor being coupled to the first terminal of the pair of differential output terminals.

10. A differential difference amplifier according to claim 1, wherein the first, second, third, and fourth current control PMOS transistors have substantially the same electrical characteristics, the first and second load current control PMOS transistors have substantially the same electrical characteristics, the first and second voltage control PMOS transistor circuits have substantially the same electrical characteristics, the first and second load current control PMOS transistors and the first and second voltage control PMOS transistor circuits have greater conductance than the first, second, third, and fourth current control PMOS transistors, the first, second, third, and fourth current control NMOS transistors have substantially the same electrical characteristics, the first and second load current control NMOS transistors have substantially the same electrical characteristics, the first and second voltage control NMOS transistor circuits have substantially the same electrical characteristics, and the first and second load current control NMOS transistors and the first and second voltage control NMOS transistor circuits have greater conductance than the first, second, third, and fourth current control NMOS transistors.

11. A differential difference amplifier according to claim 1, wherein the first bias regulator comprises:

a PMOS transistor having a source for coupling to the high voltage terminal, and a drain and a gate that are coupled to the first output terminal of the first bias regulator; and an NMOS transistor having a source for coupling to the low voltage terminal, a drain that is coupled to the drain of the PMOS transistor, and a gate that is coupled to the second output terminal of the first bias regulator, the PMOS transistor of the first bias regulator having substantially the same electrical characteristics as the first and second load current control PMOS transistors, and the NMOS transistor of the first bias regulator having substantially the same electrical characteristics as the first and second load current control NMOS transistors.

12. A differential difference amplifier according to claim 1, wherein the first bias regulator comprises:

a PMOS transistor having a source for coupling to the high voltage terminal, and a drain and a gate that are coupled to the first output terminal of the first bias regulator; and an NMOS transistor having a source for coupling to the low voltage terminal, and a drain and a gate that are coupled to the drain of the PMOS transistor and the second output terminal of the first bias regulator.

13. A differential difference amplifier according to claim 1, wherein the first bias regulator comprises:

a Schmitt inverter having an input terminal and an output terminal; and first and second resistors each having a first terminal and a second terminal, the second terminal of the first resistor being coupled to the second output terminal of the second resistor and to the input terminal of the Schmitt inverter, the output terminal of the Schmitt inverter being coupled to the first and second output terminals of the first bias regulator, the first terminal of the first resistor being coupled to the first terminal of the first pair of differential input terminals, and the first terminal of the second resistor being coupled to the second terminal of the first pair of differential input terminals.

14. A differential difference amplifier according to claim 1, wherein the first bias regulator comprises:

a PMOS transistor and an NMOS transistor each having a gate, a source, and a drain; and a resistor having a first terminal and a second terminal, the source of the PMOS transistor being coupled to the high voltage terminal, the drain of the PMOS transistor being coupled to the gate of the PMOS transistor and to the first output terminal of the first bias regulator, the source of the NMOS transistor being coupled to the low voltage terminal, the drain of the NMOS transistor being coupled to the gate of the NMOS transistor and to the second output terminal of the first bias regulator, and the first and second terminals of the resistor being coupled to the first and second output terminals of the first bias regulator, respectively.

15. A differential difference amplifier according to claim 1, wherein the first and second voltage control PMOS transistor circuits each comprises a plurality of PMOS transistors, the at least one source terminal of each of the first and second voltage control PMOS transistor circuits comprises a plurality of source terminals, the gates of the PMOS transistors of each of the first and second voltage control PMOS transistor circuits are coupled to the gate terminal of the PMOS transistor circuit, the drains of the PMOS transistors are coupled to the drain terminal of the PMOS transistor circuit, and the sources of the PMOS transistors are respectively coupled to the source terminals of the PMOS transistor circuit, the first and second voltage control NMOS transistor circuits each comprises a plurality of NMOS transistors, the at least one source terminal of each of the first and second voltage control NMOS transistor circuits comprises a plurality of source terminals, the gates of the NMOS transistors of each of the first and second voltage control NMOS transistor circuits are coupled to the gate terminal of the NMOS transistor circuit, the drains of the NMOS transistors are coupled to the drain terminal of the NMOS transistor circuit, and the sources of the NMOS transistors are respectively coupled to the source terminals of the NMOS transistor circuit.

16. A differential difference amplifier according to claim 1, wherein the first and second voltage control PMOS transistor circuits each comprises first, second, and third PMOS transistors, each of the PMOS transistors having a gate, a source, and a drain, the sources of the first PMOS transistors of the first and second voltage control PMOS transistor circuits are coupled to the drains of the first and second current control PMOS transistors, respectively, the sources of the second PMOS transistors of the first and second voltage control PMOS transistor circuits are coupled to the drains of the fourth and third current control PMOS transistors, respectively, the sources of the third PMOS transistors of the first and second voltage control PMOS transistor circuits are coupled to the drains of the first and second load current control PMOS transistors, respectively, the first and second voltage control NMOS transistor circuits each comprises first, second, and third NMOS transistors, each of the NMOS transistors having a gate, a source, and a drain, the sources of the first NMOS transistors of the first and second voltage control NMOS transistor circuits are coupled to the drains of the first and second current control NMOS transistors, respectively, the sources of the second NMOS transistors of the first and second voltage control NMOS transistor circuits are coupled to the drains of the fourth and third current control NMOS transistors, respectively, and the sources of the third NMOS transistors of the first and second voltage control NMOS transistor circuits are coupled to the drains of the first and second load current control NMOS transistors, respectively.

17. A single output differential difference amplifier comprising:

the differential difference amplifier according to claim 1; and a single output operational amplifier comprising first and second input terminals and a single-ended output terminal, the first and second terminals of the pair of differential output terminals of the differential difference amplifier being coupled to the first and second input terminals, respectively, of the single output operational amplifier.

18. A single output differential difference amplifier according to claim 17, wherein the single output operational amplifier comprises:

first and second NMOS transistors each having a gate, a source, and a drain, the sources for coupling to the low voltage terminal; and first and second PMOS transistors each having a gate, a source, and a drain, the sources for coupling to the high voltage terminal, the drain of the first NMOS transistor being coupled to the drain of the first PMOS transistor and to the gates of the first and second PMOS transistors, the gate of the first NMOS transistor being coupled to the first input terminal of the single output operational amplifier, the gate of the second NMOS transistor being coupled to the second input terminal of the single output operational amplifier, and the drains of the second NMOS transistor and the second PMOS transistor being coupled to the single-ended output terminal of the single output operational amplifier.

19. A differential receiver comprising:

the single-output differential difference amplifier according to claim 17;

an offset voltage generator comprising:

first, second, and third capacitors each having a first terminal and a second terminal; and first, second, third, and fourth switches each having a first terminal and a second terminal, the first terminal of the first switch for coupling to the high voltage terminal, the second terminal of the first switch being coupled to the first terminal of the first capacitor and to the second terminal of the second switch, the first terminal of the second switch being coupled to the first terminal of the third switch, to the second terminal of the second capacitor, and to the second terminal of the third capacitor, the first terminal of the second switch for coupling to a voltage of approximately half the voltage level as the high voltage terminal, the second terminal of the third switch being coupled to the second terminal of the first capacitor, to the first terminal of the second capacitor, and to the first terminal of the fourth switch, and the second terminal of the fourth switch being coupled to the first terminal of the third capacitor; and a differential voltage selector to selectively couple, to the first and second terminals of the second differential input terminal of the differential difference amplifier, (i) the first and the second terminals, respectively, of the third capacitor, or (ii) the second and the first terminals, respectively, of the third capacitor, according to the output voltage of the single-output differential difference amplifier.

20. A differential output differential difference amplifier comprising:

the differential difference amplifier according to claim 1; and a differential output operational amplifier comprising first and second input terminals and first and second terminals of a pair of amplified differential output terminals, the first and second terminals of the pair of differential output terminals of the differential difference amplifier being coupled to the first and second input terminals, respectively, of the differential output operational amplifier.

21. A differential output differential difference amplifier according to claim 20, wherein the differential output operational amplifier comprises:
first and second NMOS transistors each having a gate, a source, and a drain, the sources for coupling to the low voltage terminal;
first and second PMOS transistors each having a gate, a source, and a drain, the sources for coupling to the high voltage terminal; and
first and second resistors each having a first terminal and a second terminal,
the second terminal of the first resistor being coupled to the first terminal of the second resistor and to the gates of the first and second PMOS transistors,
the gate of the first NMOS transistor being coupled to the first input terminal of the differential output operational amplifier,
the gate of the second NMOS transistor being coupled to the second input terminal of the differential output operational amplifier,
the drain of the first NMOS transistor being coupled to the drain of the first PMOS transistor, to the first terminal of the first resistor, and to the second terminal of the pair of amplified differential output terminals, and
the drain of the second NMOS transistor being coupled to the drain of the second PMOS transistor, to the second terminal of the second resistor, and to the first terminal of the pair of amplified differential output terminals.

22. A differential receiver comprising:
the differential output differential difference amplifier according to claim 20; and
an offset voltage generator comprising:
first, second, and third resistors each having first and second terminals,
the first terminal of the first resistor being coupled to the first terminal of the pair of differential output terminals of the differential output differential difference amplifier,
the second terminal of the first resistor being coupled to the first terminal of the second resistor and to the second terminal of the second pair of differential input terminals of the differential output differential difference amplifier,
the second terminal of the second resistor being coupled to the first terminal of the third resistor and to the first terminal of the second pair of differential input terminals of the differential output differential difference amplifier, and
the second terminal of the third resistor being coupled to the second terminal of the pair of differential output terminals of the differential output differential difference amplifier.

23. A differential output differential difference comparator comprising:
the differential difference amplifier according to claim 1; and
a differential output comparator comprising first and second input terminals and first and second terminals of a pair of comparator differential output terminals,
the first and second terminals of the pair of differential output terminals of the differential difference amplifier being coupled to the first and second input terminals, respectively, of the differential output comparator.

24. A differential output differential difference comparator according to claim 23, wherein the differential output comparator comprises:
first and second NMOS transistors each having a gate, a source, and a drain, the sources of the first and second NMOS transistors for coupling to the low voltage terminal;
first and second PMOS transistors each having a gate, a source, and a drain, the sources for coupling to the high voltage terminal; and
first, second, and third resistors each having a first terminal and a second terminal,
the second terminal of the first resistor and the first terminal of the second resistor being coupled to the gate of the second PMOS transistor,
the second terminal of the second resistor and the first terminal of the third resistor being coupled to the gate of the first PMOS transistor,
the gate of the first NMOS transistor being coupled to the first input terminal of the differential output comparator,
the gate of the second NMOS transistor being coupled to the second input terminal of the differential output comparator,
the drain of the first NMOS transistor being coupled to the drain of the first PMOS transistor, to the first terminal of the first resistor, and to the second terminal of the pair of comparator differential output terminals, and
the drain of the second NMOS transistor being coupled to the drain of the second PMOS transistor, to the second terminal of the third resistor, and to the first terminal of the pair of comparator differential output terminals.

25. A differential receiver comprising:
the differential difference amplifier according to claim 1;
a center voltage generator comprising:
first, second, third, fourth, fifth, and sixth NMOS transistors each having a gate, a source, and a drain,
the sources of the first, second, third, and fourth NMOS transistors for coupling to the low voltage terminal,
the drains of the first and second NMOS transistors being coupled to the source of the fifth NMOS transistor,
the drains of the third and fourth NMOS transistors being coupled to the source of the sixth NMOS transistor,
the gate of the first NMOS transistor being coupled to the second terminal of the pair of differential output terminals, and
the gate of the second NMOS transistor being coupled to the first terminal of the pair of differential output terminals; and
first and second PMOS transistors each having a gate, a source, and a drain,
the drain of the fifth NMOS transistor being coupled to the gate of the fifth NMOS transistor, to the gate of the sixth NMOS transistor, to the drain of the first PMOS transistor, and to the gates of the first and second PMOS transistors,
the gate of the third NMOS transistor being coupled to the gate of the fourth NMOS transistor and to the drain of the sixth NMOS transistor, and
the sources of the first and second PMOS transistors for coupling to the high voltage terminal;
a first offset voltage circuit comprising:
a third PMOS transistor having a gate, a source, and a drain; and
seventh, eighth, and ninth NMOS transistors each having a gate, a source, and a drain, the drain of the ninth NMOS transistor being coupled to the drain of the third PMOS transistor, to the gate of the seventh NMOS transistor, and to the first terminal of the second pair of differential input terminals of the differential difference amplifier, the gate of the ninth NMOS transistor being coupled to the gate of the sixth NMOS transistor, and the gate of the eighth NMOS transistor being coupled to the gate of the fourth NMOS transistor; and a second offset voltage circuit comprising:

a fourth PMOS transistor having a gate, a source, and a drain, the gate of the fourth PMOS transistor being coupled to the gate of the third PMOS transistor and to the gate of the second PMOS transistor; and tenth, eleventh, and twelfth NMOS transistors each having a gate, a source, and a drain, the drain of the twelfth NMOS transistor being coupled to the drain of the fourth PMOS transistor, to the gate of the tenth NMOS transistor, and to the second terminal of the second pair of differential input terminals of the differential difference amplifier, and the gate of the eleventh NMOS transistor being coupled to the gate of the eighth NMOS transistor of the first offset voltage circuit, wherein the first, second, third, fourth, eighth, and eleventh NMOS transistors have substantially the same electrical characteristics, the seventh NMOS transistor has a smaller conductance than that of the eighth NMOS transistor, and the tenth NMOS transistor has a greater conductance than that of the eleventh NMOS transistor.

26. A modulating differential difference amplifier comprising:

the differential difference amplifier according to claim 1; and a modulator coupled to the second output terminal of the first bias regulator to supply a modulation signal.

27. A differential difference amplifier according to claim 1, wherein the sources of the first, second, third, and fourth current control PMOS transistors and the sources of the first and second load current control PMOS transistors are coupled to the high voltage terminal, the sources of the first, second, third, and fourth current control NMOS transistors and the first and second load current control NMOS transistors are coupled to the low voltage terminal, the first bias regulator comprises first and second inverters each having an input terminal and an output terminal, the output terminal of the first inverter is coupled to the output terminal of the second inverter and to the first and second output terminals of the first bias regulator, the input terminal of the first inverter is coupled to the first terminal of the first pair of differential input terminals, the input terminal of the second inverter is coupled to the second terminal of the first pair of differential input terminals, the gates of the first and second load current control PMOS transistors are coupled to the first output terminal of the first bias regulator, and the gates of the first and second load current control NMOS transistors are coupled to the second output terminal of the second output terminal of the first bias regulator.

28. A differential difference amplifier according to claim 1, wherein the sources of the first, second, third, and fourth current control PMOS transistors and the sources of the first and second load current control PMOS transistors are coupled to the high voltage terminal, the sources of the first, second, third, and fourth current control NMOS transistors and the first and second load current control NMOS transistors are coupled to the low voltage terminal, the gates of the first and second load current control PMOS transistors are coupled to the first output terminal of the first bias regulator, and the gates of the first and second load current control NMOS transistors are coupled to the second output terminal of the first bias regulator.

29. A differential difference amplifier according to claim 1, wherein the sources of the first, second, third, and fourth current control PMOS transistors and the sources of the first and second load current control PMOS transistors are coupled to the high voltage terminal, the sources of the first, second, third, and fourth current control NMOS transistors and the sources of the first and second load current control NMOS transistors are coupled to the low voltage terminal, the gates of the first and second load current control PMOS transistors are coupled to the first and second output terminals, respectively, of the second bias regulator, and the gates of the first and second load current control NMOS transistors are coupled to the first and second bias output terminals, respectively, of the second bias regulator.

30. A differential difference amplifier comprising:

first and second low supply output terminals and first and second high supply output terminals, one or more of the first and second low supply output terminals and one or more of the first and second high supply output terminals being coupled to a low voltage terminal and a high voltage terminal, respectively;

a first bias regulator comprising a first output terminal to supply a first bias voltage and a second output terminal to supply a second bias voltage;

a second bias regulator comprising first and second output terminals;

first, second, third, and fourth current control PMOS transistors each having a gate, a source, and a drain, the sources being coupled to one another and to the second high supply output terminal, the gates of the first and second current control PMOS transistors being coupled to first and second terminals of a first pair of differential input terminals, respectively, and the gates of the third and fourth current control PMOS transistors being coupled to first and second terminals of a second pair of differential input terminals, respectively;

first and second load current control PMOS transistors each having a gate, a source, and a drain, the sources being coupled to the first high supply output terminal, and the gates of the first and second load current control PMOS transistors being coupled to the first and second output terminals, respectively, of the second bias regulator;

first, second, third, and fourth current control NMOS transistors each having a gate, a source, and a drain, the sources being coupled to each other and to the second low supply output terminal, the gates of the first and second current control NMOS transistors being coupled to the first and second terminals of the first pair of differential input terminals, respectively, and the gates of the third and fourth current control NMOS transistors being coupled to the first and second terminals of the second pair of differential input terminals, respectively;

first and second load current control NMOS transistors each having a gate, a source, and a drain, the sources being coupled to the first low supply output terminal, and the gates being coupled to the first and second output terminals, respectively, of the second bias regulator;

first and second voltage control PMOS transistor circuits each having a gate terminal, at least one source terminal, and a drain terminal, the at least one source terminal of the first voltage control PMOS transistor circuit being coupled to the drains of the first and fourth current control PMOS transistors and to the drain of the first load current control PMOS transistor, the at least one source terminal of the second voltage control PMOS transistor circuit being coupled to the drains of the second and third current control PMOS transistors and to the drain of the second load current control PMOS transistor, the gate terminals of the first and second voltage control PMOS transistor circuits being coupled to the first output terminal of the first bias regulator; and first and second voltage control NMOS transistor circuits each having a gate terminal, at least one source terminal, and a drain terminal, the at least one source terminal of the first voltage control NMOS transistor circuit being coupled to the drains of the first and fourth current control NMOS transistors and to the drain of the first load current control NMOS transistor, the at least one source terminal of the second voltage control NMOS transistor circuit being coupled to the drains of the second and third current control NMOS transistors and to the drain of the second load current control NMOS transistor, the gate terminals of the first and second voltage control NMOS transistor circuits being coupled to the second output terminal of the first bias regulator, the drain terminals of the second voltage control PMOS transistor circuit and the second voltage control NMOS transistor circuit being coupled to a first terminal of a pair of differential output terminals, and the drain terminals of the first voltage control PMOS transistor circuit and the first voltage control NMOS transistor circuit being coupled to a second terminal of the pair of differential output terminals.

\* \* \* \* \*